United States Patent
Vinegar et al.

(10) Patent No.: US 11,933,932 B1
(45) Date of Patent: Mar. 19, 2024

(54) METHOD OF ESTIMATING PERMEABILITY USING NMR DIFFUSION MEASUREMENTS

(71) Applicants: Vinegar Technologies LLC, Bellaire, TX (US); William Marsh Rice University, Houston, TX (US)

(72) Inventors: Harold J. Vinegar, West Lake Hills, TX (US); Philip M. Singer, Richmond, TX (US); George J. Hirasaki, Bellaire, TX (US); Zeliang Chen, Houston, TX (US); Xinglin Wang, Houston, TX (US); Eva Vinegar, Bellaire, TX (US)

(73) Assignee: VINEGAR TECHNOLOGIES LLC, West Lake Hills, TX (US)

( * ) Notice: Subject to any disclaimer, the term of this patent is extended or adjusted under 35 U.S.C. 154(b) by 0 days.

(21) Appl. No.: 17/224,098

(22) Filed: Apr. 6, 2021

Related U.S. Application Data

(60) Provisional application No. 63/005,482, filed on Apr. 6, 2020.

(51) Int. Cl.
| | |
|---|---|
| *G01V 3/32* | (2006.01) |
| *E21B 49/08* | (2006.01) |
| *G01N 24/08* | (2006.01) |
| *G01R 33/50* | (2006.01) |

(52) U.S. Cl.
CPC ............... *G01V 3/32* (2013.01); *E21B 49/08* (2013.01); *G01N 24/081* (2013.01); *G01R 33/50* (2013.01)

(58) Field of Classification Search
CPC ........ G01R 33/50; G01N 24/081; G01V 3/32; E21B 49/08
See application file for complete search history.

(56) References Cited

U.S. PATENT DOCUMENTS

| | | | | |
|---|---|---|---|---|
| 5,497,087 A | * | 3/1996 | Vinegar | G01V 3/32 324/303 |
| 11,131,186 B1 | * | 9/2021 | Al-Garadi | G01V 3/14 |
| 2015/0168588 A1 | | 6/2015 | Vinegar et al. | |
| 2015/0184500 A1 | | 7/2015 | Vinegar et al. | |
| 2015/0210917 A1 | | 7/2015 | Vinegar et al. | |

(Continued)

OTHER PUBLICATIONS

Chen, Z.; Singer, P. M.; Jun, K.; Vargas, F. P.; Hirasaki, G. J.; Jun, K.; Vargas, F. P.; Hirasaki, G. J. Effects of Bitumen Extraction on the 2D NMR Response of Saturated Kerogen Isolates. Petrophysics 2017, 58, 470-484.

(Continued)

*Primary Examiner* — Gregory H Curran
(74) *Attorney, Agent, or Firm* — Momentum IP; Marc Van Dyke

(57) ABSTRACT

This invention is useful for determining the permeability of a geological formation using $^1$H NMR diffusion measurements acquired in the laboratory and using downhole $^1$H NMR well logging. The current technology for obtaining formation permeability downhole using NMR is not adequate for low-permeability, unconventional source rock formations with high organic content. This new method uses laboratory $^1$H NMR diffusion measurements for creating continuous downhole well logs of the mobile-hydrocarbon permeability of the hydrocarbon-filled pore space of downhole geological formations.

21 Claims, 27 Drawing Sheets

(56) References Cited

U.S. PATENT DOCUMENTS

2015/0329785 A1    11/2015    Vinegar et al.

OTHER PUBLICATIONS

Fleury, M.; Romero-Sarmiento, M. Characterization of Shales Using T1-T2 NMR Maps. Journal of Petroleum Science and Engineering 2016, 137, 55-62.

Hürlimann, M. D .; Helmer, K. G .; Latour, L. L .; Sotak, C. H. Restricted Diffusion in Sedimentary Rocks. Determination of Surface-Area-to-vol. Ratio and Surface Relaxivity. Journal of Magnetic Resonance, Series A 1994, 111, 169- 178.

Chen, Z., Singer, P.M., Wang, X., Hirasak, G.J., Vinegar, H.J., 2019: Evaluation of Light Hydrocarbon Composition, Pore Size, and Tortuosity in Organic-Rich Chalks using NMR Core Analysis and Logging, Society of Petrophysicists and Well-Log Analysts, SPWLA-2019-K.

Kausik, R.; Minh, C. C.; Zielinski, L.; Vissapragada, B.; Akkurt, R.; Song, Y.; Liu, C.; Jones, S.; Blair, E. Characterization of Gas Dynamics in Kerogen Nanopores by NMR. SPE 147198, 2011, 1-16.

Archie, G. E., 2003: The Electrical Resistivity Log as an Aid in Determining Some Reservoir Characteristics. SPE Reprint Series, 146, 9-16.

Krynicki, K.; Green, C. D.; Sawyer, D. W. Pressure and Temperature Dependence of Self-Diffusion in Water. Faraday Discussions of the Chemical Society 1978, 66, 199-208.

Latour, L. L.; Mitra, P. P.; Kleinberg, R. L.; Sotak, C. H. Time-Dependent Diffusion Coefficient of Fluids in Porous Media as a Probe of Surface-to-Volume Ratio. Journal of Magnetic Resonance, Series A 1993, 101, 342-346.

Lo, S.- W.; Hirasaki, G. J.; House, W. V.; Kobayashi, R. Mixing Rules and Correlations of NMR Relaxation Time with Viscosity, Diffusivity, and Gas/Oil Ratio of Methane/Hydrocarbon Mixtures. Society of Petroleum Engineers (SPE) Journal 2002, 7, 1-4.

Minh, C. C.; Crary, S.; Singer, P. M.; Valori, A.; Bachman, N.; Hursan, G. G.; Ma, S. M.; Belowi, A.; Kraishan, G. Determination of Wettability from Magnetic Resonance Relaxation and Diffusion Measurements on Fresh-State Cores. SPWLA 56th Annual Logging Symposium 2015.

Mitchell, J.; Gladden, L. F.; Chandrasekera, T. C.; Fordham, E. J. Low-Field Permanent Magnets for Industrial Process and Quality Control. Progress in Nuclear Magnetic Resonance Spectroscopy 2014, 76, 1-60.

Wang, H. J.; Mutina, A.; Kausik, R. High-field Nuclear Magnetic Resonance Observation of Gas Shale Fracturing by Methane Gas. Energy & Fuels 2014, 28, 3638-3644.

Yang, Z.; Hirasaki, G. J.; Appel, M.; Reed, D. A. Viscosity Evaluation for NMR Well Logging of Live Heavy Oils. Petrophysics 2012, 53, 22-37.

Oosting, P. H.; Trappeniers, N. J. Proton Spin-Lattice Relaxation and Self-Diffusion in Methanes. IV. Self-diffusion in methane. Physica 1971, 51, 418-431.

Singer, P. M.; Chen, Z.; Hirasaki, G. J. Fluid Typing and Pore Size in Organic Shale using 2D NMR in Saturated Kerogen. Petrophysics 2016, 57, 604-619.

Cotts, R.M., Hoch, M.J.R., Sun, T., Markert, J.T.; 1989: Pulsed Field Gradient Stimulated Echo Methods for Improved NMR Diffusion Measurements in Heterogeneous Systems. J. Magn. Reason. 83(2), 252-266.

Singer, P. M.; Asthagiri, D.; Chapman, W. G.; Hirasaki, G. J. Molecular Dynamics Simulations of NMR Relaxation and Diffusion of Bulk Hydrocarbons and Water. Journal of Magnetic Resonance 2017, 277, 15-24.

Singer, P. M.; Chen, Z.; Alemany, L. B.; Hirasaki, G. J.; Zhu, K.; Xie, Z. H.; Vo, T. D. Interpretation of NMR Relaxation in Bitumen and Organic Shale Using Polymer-Heptane Mixes. Energy & Fuels 2018, 32, 1534-1549.

Singer, P. M.; Asthagiri, D.; Chapman, W. G.; Hirasaki, G. J. NMR Spin-Rotation Relaxation and Diffusion of Methane. The Journal of Chemical Physics 2018, 148.

Singer, P. M.; Asthagiri, D.; Chen, Z.; Valiya Parambathu, A.; Hirasaki, G. J.; Chapman, W. G. Role of Internal Motions and Molecular Geometry on the NMR Relaxation of Hydrocarbons. Journal of Chemical Physics 2018, 148.

Sigal, R. F. Pore-Size Distributions for Organic-Shale-Reservoir Rocks from Nuclear-Magnetic-Resonance Spectra Combined with Adsorption Measurements. Society of Petroleum Engineers (SPE) Journal 2015, 20, 1-7.

Thern, H.; Horch, C.; Stallmach, F.; Li, B.; Mezzatesta, A.; Zhang, H.; Arro, R. Low-field NMR Laboratory Measurements of Hydrocarbons Confined in Organic Nanoporous Media at Various Pressures. Microporous and Mesoporous Materials 2018, 269, 21-25.

Chang, D., Vinegar, H.J., Morriss, C., Straley, C., 1994: Effective Porosity, Producible Fluid and Permeability in Carbonates from NMR Logging, Society of Petrophysicists and Well-Log Analysts, SPWLA-1994-A.

Valori, A.; Van Den Berg, S.; Ali, F.; Abdallah, W. Permeability Estimation from NMR Time Dependent Methane Saturation Monitoring in Shales. Energy & Fuels 2017, 31, 5913-5925.

Venkataramanan, L.; Song, Y.; Hurlimann, M. D. Solving Fredholm Integrals of the First Kind with Tensor Product Structure in 2 and 2.5 Dimensions. IEEE Transaction on Signal Processing 2002, 50 (5), 1017-1026.

Co-pending U.S. Appl. No. 16/842,928, filed Apr. 8, 2020.

Co-pending U.S. Appl. No. 17/224,098, filed Apr. 6, 2021.

Co-pending U.S. Appl. No. 17/224,093, filed Apr. 6, 2021.

Zielinski, L.; Ramamoorthy, R.; Minh, C. C.; Al Daghar, K. A.; Sayed, R. H.; Abdelaal, A. F., 2010: Restricted Diffusion Effects in Saturation Estimates From 2D Diffusion-Relaxation NMR Maps. Society of Petroleum Engineers.

Wang, X., Singer, P.M., Chen, Z., Hirasaki, G.J., Vinegar, H.J., 2020: a New Method of Estimating Tortuosity and Pore Size in Unconventional Formations using NMR Restricted Diffusion Measurements, Society of Petrophysicists and Well-Log Analysts.

Wyllie, M. R. J.; Rose, W. D., 1950: Some Theoretical Considerations Related to the Quantitative Evaluation of the Physical Characteristics of Reservoir Rock From Electrical Log Data, Journal of Petroleum Technology., 2, 105-118.

Chen, Z., Singer, P.M., Wang, X., Vinegar, H.J., Nguyen, S.V., Hirasaki, G.J., 2019: NMR Evaluation of Light-Hydrocarbon Composition, Pore Size, and Tortuosity in Organic-Rich Chalks, Petrophysics 60 (06), 771-797.

Webber, J.B.W., 2010 Studies of Nano-Structured Liquids in Confined Geometries and at Surfaces, Progress in Nuclear Magnetic Resonance Spectroscopy 56 78-93.

Timur, R., , 1969: Pulsed Nuclear Magnetic Resonance Studies of Porosity, Movable Fluid, and Permeability of Sandstones, Society Petroleum Engineers, SPE-2045-PA.

Yang, K.; Li, M.; Ling, N. N. A.; May, E. F.; Connolly, P. R. J.; Esteban, L.; Clennell, M. B.; Mahmoud, M.; El-Husseiny, A.; Adebayo, A. R.; Elsayed, M. M.; Johns, M. L., 2019: Quantitative Tortuosity Measurements of Carbonate Rocks Using Pulsed Field Gradient NMR, Transport in Porous Media., 130, 847-865.

Zecca, M.; Vogt, S. J.; Connolly, P. R. J.; May, E. F.; Johns, M. L., 2018: NMR Measurements of Tortuosity in Partially Saturated Porous Media. Transport in Porous Media., 125, 271-288.

Tofts, P.S., Lloyd, D., Clark, C.A., Barker, G.J., Parker, G.J.M., McConville, P., Baldock, C., Pope, J.M., 2000 Test Liquids for Quantitative MRI Measurements of Self-Diffusion Coefficient In Vivo, Magn. Reson. Med. 43, 368-374.

Muller-Huber, E., Schon, J., Borner, F., 2016 a Pore Body-Pore Throat-Based Capillary Approach for NMR Interpretation in Carbonate Rocks using the Coates Equation, Society of Petrophysicists and Well-Log Analysts.

Sander, R.; Pan, Z.; Connell, L. D., 2017: Laboratory Measurement of Low Permeability Unconventional Gas Reservoir Rocks: a Review of Experimental Methods. Journal of Natural Gas Science and Engineering., 37, 248-279.

(56) References Cited

OTHER PUBLICATIONS

Swanson, B. F., 1981: a Simple Correlation Between Permeabilities and Mercury Capillary Pressures. Society of Petroleum Engineers. Journal of Petroleum Technology., 33, 2498-2504.

Tanner, J. E., 1970: Use of the Stimulated Echo in NMR Diffusion Studies. The Journal of Chemical Physics., 52, 2523-2526.

Souza, A., Carneiro, G., Zielinski, L., Polinski, R., Schwartz, L., Hürlimann, M.D., Boyd, A., Rios, E.H., Camilo dos Santos, B.C., Trevizan, W.A., Machado, F.V., Azeredo, R.B.V., 2013: Permeability Prediction Improvement using 2D NMR Diffusion-T2 Maps, Society of Petrophysicists and Well-Log Analysts, SPWLA-2013-U.

Straley, C., Rossini, D., Vinegar, H.J., Tutunjian, P., Morriss, C., 1997: Core Analysis by Low-Field NMR, Society of Petrophysicists and Well-Log Analysts, SPWLA-1997-v38n2a3.

Vinegar, E. G.; Rosenberg, Y. O.; Reznick, I.; Gordin, Y.; Singer, Philip M. S.; Wang, X.; Chen, Z.; Nguyen, S. V.; Li, W.; Bradley, T.; Hirasaki, G. J.; Lake, L. W.; Feinstein, S.; Hatzor, Y. H.; Vinegar, H. J., 2020. What Happens to the Petrophysical Properties of a Dual-Porosity Organic-Rich Chalk During Early-Stage Organic Maturation? Society of Petrophysicists and Well-Log Analysts.

Singer, J.M., Johnston, L., Kleinberg, R.L., Flaum, C., 1997, Fast NMR Logging for Bound Fluid and Permeability, Society of Petrophysicists and Well-Log Analysts, SPWLA-1997-YY.

Mitra, P. P.; Sen, P. N., 1992: Effects of Microgeometry and Surface Relaxation on NMR Pulsed-Field-Gradient Experiments: Simple Pore Geometries. Physical Review B., 45, 143-156.

Hirasaki, G. J., Rohan, J. A., Dudley, J. W., 1995: Interpretation of Oil-Water Relative Permeabilities from Centrifuge Experiments. SPE Advanced Technology Series, vol. 3, No. 1, pp. 66-75.

Hidajat, I., Mohanty, K.K., Flaum, M., Hirasaki, G.J., 2004, Study of Vuggy Carbonates Using NMR and X-Ray CT Scanning, SPE Reservoir Evaluation & Engineering, SPE 88995.

Lee, A.L., Ellington, R.T., 1965, Viscosity of n-Decane in the Liquid Phase, Journal of Chemical and Engineering Data, 346-348.

Glover, P. W. J., 2016: Archie's Law—a Reappraisal. Solid Earth., 7, 1157-1169.

Kenyon, W.E., Day, P.I., Straley, C., Willemsen, J.F., 1988: a Three-part Study of NMR Longitudinal Relaxation Properties of Water-saturated Sandstones, Society Petroleum Engineers, SPE-15643-PA.

Epstein, N., 1989: on Tortuosity and the Tortuosity Factor in Flow and Diffusion Through Porous Media, Chemical Engineering Science., 44, 777-779.

Carman, P. C., 1997: Fluid Flow Through Granular Beds, Process Safety and Environmental Protection: Transactions of the Institution of Chemical Engineers, Part B., 75, S32-S48.

Coates G.R., Miller, M., Gillen, M., Henderson, C., 1991: the MRIL in Conoco 33-1: an Investigation of a New Magnetic Resonance Imaging Log, Society of Petrophysicists and Well-Log Analysts, SPWLA-1991-DD.

Chen, Z., Wang, X., Jian, G., Zhang, L., Dong, P., Singer, P. M., & Hirasaki, G. J., 2020: Fast Permeability Estimation of an Unconventional Formation Core by Transient-Pressure History Matching, Society Petroleum Engineers Journal.

Bernabé, Y.; Mok, U.; Evans, B., 2006: a Note on the Oscillating Flow Permeability. International Journal of Rock Mechanics and Mining Sciences, 43, 311-316.

Carey, G. R.; McBean, E. A.; Feenstra, S., 2016: Estimating Tortuosity Coefficients Based on Hydraulic Conductivity. Groundwater, 54, 476-487.

Tinni, A.; Sondergeld, C.; Rai, C. New Perspectives on the Effects of Gas Adsorption on Storage and Production of Natural Gas from Shale Formations. 2018, 59, 99-104.

Singer, P. M.; Chen, Z.; Alemany, L. B.; Hirasaki, G. J.; Zhu, K.; Xie, Z. H. Z. H.; Vo, T. D. NMR Relaxation of Polymer-Alkane Mixes, a Model System for Crude Oils. SPWLA 58th Annual Logging Symposium 2017.

Kausik, R.; Fellah, K.; Rylander, E.; Singer, P. M.; Lewis, R. E.; Sinclair, S. M. NMR Relaxometry in Shale and Implications for Logging. Petrophysics 2016, 57, 339-350.

Hürlimann, M. D.; Freed, D. E.; Zielinski, L. J.; Song, Y. Q.; Leu, G.; Straley, C.; Minh, C. C.; Boyd, A. Hydrocarbon Composition from NMR Diffusion and Relaxation Data. Petrophysics 2009, 50, 116-129.

Co-pending U.S. Appl. No. 17/224,093 (applicant Vinegar Technologies LLC) filed Apr. 6, 2021.

* cited by examiner

US 11,933,932 B1

METHOD OF ESTIMATING PERMEABILITY USING NMR DIFFUSION MEASUREMENTS

CROSS-REFERENCE TO RELATED APPLICATIONS

This patent application claims the benefit of U.S. Provisional Patent Application No. 63/005,482 filed on Apr. 6, 2020, which is incorporated herein by reference in its entirety.

BACKGROUND AND RELATED ART

The present invention relates to petroleum reservoir fluid and petrophysical characterization. In particular, the present invention is useful for quantifying the mobile-hydrocarbon permeability of an unconventional reservoir using NMR logging and core analysis.

Over the last 10-20 years, the oil industry has been targeting formations with lower and lower permeabilities. In recent years, with the availability of horizontal drilling and hydrofracturing technology combined with downward pressure on the price of petroleum, targeting ultra-tight subsurface formations has now become industry standard. The permeability of the formation to hydrocarbon flow is critical to determining the economic viability of the well.

Unfortunately, conventional techniques for measuring downhole permeability become less accurate at lower permeabilities, leading the oil industry to choose between two bad options, either:
  (i) live without accurate downhole permeability measurements
  or
  (ii) increase the density of locations at which core samples are extracted from the subsurface.

In the current competitive price environment, neither option is acceptable. There is therefore an ongoing need for novel techniques which accurately measure downhole permeability with a minimum reliance on core sampling. The permeability is important for determining whether to case and cement casing in a drilled well, where to perforate the casing, and whether to deploy a subsurface pump.

It is well known that pore-throat size and permeability are strongly correlated, therefore a measure of pore-throat size can in principle be used to estimate permeability through empirical models. It is also well known that for certain sedimentary rocks, the distribution in NMR $T_2$ relaxation time is a good measure of the pore-body size distribution. These conjectures form the basis of two well-known NMR permeability models: (1) the Timur-Coates model (Timur 1969, Coates 1991), and (2) the SDR (Schlumberger-Doll Research) model (a.k.a. the Kenyon model) (Kenyon 1988). Both NMR permeability models are based on the underlying assumption that the pore-body to pore-throat ratio (BTR) is roughly constant for all pores, and therefore the $T_2$ distribution is a good measure of the pore-throat distribution. Both models were originally developed for sandstones, though both have also been used for carbonates with variable success.

The Timur-Coates model separates the $T_2$ distribution into two regions: (1) the bound-water (i.e. clay-bound plus capillary-bound) below $T_2 < T_{2,cutoff}$, and (2) the free (i.e. movable) water above $T_2 > T_{2,cutoff}$. The empirical model by Timur-Coates is then given by:

$$k_{TC} = A\phi^m \left(\frac{FFV}{BFV}\right)^n$$

where $\phi$ (v/v) is the total porosity as a dimensionless fraction (v/v), i.e. pore-volume/bulk-volume, FFV (v/v) is the free-fluid volume corresponding to the NMR porosity above $T_2 > T_{2,cutoff}$, and BFV (v/v) is the bound-fluid volume corresponding to the NMR porosity below $T_2 < T_{2,cutoff}$. The default values for the four empirical parameters are $A = 10^4$ mD, m=4, n=2, and $T_{2,cutoff} = 33$ ms for sandstones or $T_{2,cutoff} = 92$ ms for carbonates [Straley 1997]. Often these four free parameters are adjusted from core measurements over a range of permeabilities for a given rock-type.

The SDR model computes the logarithmic mean $T_{2LM}$ of the $T_2$ distribution, where $T_{2LM}$ is taken as a good measure for the average pore-throat size, assuming the BTR is roughly constant for all the pores. The empirical model by SDR is then given by:

$$k_{SDR} = A\phi^m T_{2LM}^n$$

where $\phi$ (v/v) is the total porosity. The default values for the three empirical parameters in are $A=4.6$ mD/ms$^2$ for sandstones or $A=0.46$ mD/ms$^2$ for carbonates, m=4, and n=2 (Singer 1997). Often these three free parameters are adjusted from core measurements over a range of permeabilities for a given rock-type. Some improvements of Eq. X) exist where $T_{2LM}^n$ is replaced by $(\rho_2 T_{2LM})^n$ (Souza 2013), where $\rho_2$ is the NMR surface-relaxivity parameter measured from core. $\rho_2 T_{2LM}$ has the dimensions of a length-scale (µm), which gives the right dimensions for permeability (µm$^2$=1 Darcy) when n=2.

Both the Timur-Coates and the SDR models break down if (1) there is a significant amount of vuggy porosity with poor connectivity, e.g. oomolds, (2) there is a significant amount of diffusive coupling between movable fluid and bound fluid, in which case the $T_2$ distribution is not a good measure of the pore-body size distribution, and/or (3) there is a significant amount of movable heavy-oil or oil-based mud with signal below $T_2 < T_{2,cutoff}$.

The Kenyon permeability and Timur-Coates NMR permeability models are commonly utilized for estimating permeability in cores and downhole well logs. Both methods rely on surface relaxivity, which can vary with wettability and iron content, and they assume the pores are not in the strong diffusive-coupling regime, which is often incorrect in complex carbonates with micritic and macro pores.

Hence there is a strong need for a new NMR method, in the laboratory and in downhole logging, that solves these problems.

Tortuosity and Permeability

Several different definitions for tortuosity exist including electrical, hydraulic, geometry and diffusive tortuosity (Carman, 1997; Carey et al., 2016).

Electrical tortuosity ($\tau_e$) is determined from the formation resistivity (Wyllie et al., 1950):

$$\tau_e = F_R \phi$$

where $F_R$ is the resistivity formation factor, and $\phi$ is the porosity. $F_R$ is defined as the ratio of the resistivity of the brine-saturated core divided by that of bulk brine. Electrical tortuosity, measured in lab on brine-saturated cores, is often used in the field for electrical resistivity interpretation. However, it may not work well for estimating hydrocarbon permeability of some complex pore-system like the organic-rich chalk discussed in this manuscript. The electrical tortuosity ($\tau_E$) fails to match the D-$T_2$ map unlike the diffusive tortuosity measured from NMR. The hydrocarbon diffusive tortuosity may be a better tortuosity to use instead of the electrical tortuosity when focusing on the hydrocarbon bearing zone's space information in both laboratory and downhole condition. The diffusive tortuosity of the hydrocarbon-bearing zone also has the potential in the core-log integration to help interpreting the downhole log data.

Archie's law describes the relationship between the formation factor and the porosity (Archie, 2003):

$$F_R = \phi^{-m}$$

where m is the Archie cementation exponent. In general, m for conventional formation's sandstone and carbonates is below 3 (Glover, 2016).

Hydraulic tortuosity ($\tau_{hy}$) is defined as (Epstein, 1989):

$$\tau_{hy} = \left(\frac{L_e}{L}\right)^2$$

where $L_e$ is the true travel length for molecule, and L is the direct geometry length of that path (Carman, 1997).

Diffusive tortuosity ($\tau$) is used to represent the molecular diffusion impedance. It is defined by the effective restricted self-diffusion in the porous media and the free self-diffusion of the bulk fluid as:

$$\tau = \frac{D_0}{D_\infty}$$

where $D_0$ is the free self-diffusion of the bulk fluid and the $D_\infty$ is the restricted self-diffusion in the tortuosity limit.

There are several existing ways to estimate the tortuosity based on the porosity and formation factor (Carey et al., 2016; Glover, 2016). However, this is not widely applicable when dealing with complex pore structures and clay conduction. It is important to note that tortuosity determined from electrical resistivity is the tortuosity of the brine phase. The tortuosity of the hydrocarbon phase is of interest. An estimation of diffusive tortuosity from NMR measurements has been developed (Latour et al., 1993; Zecca et al., 2018; Chen et al., 2019 and 2020; Yang et al., 2019). Here we further extend this NMR restricted diffusion method to probe the hydrocarbon-filled tortuosity and hydrocarbon-filled pore-body size of an organic-rich chalk with low permeability (0.017-0.035 mD).

The Carman-Kozeny estimate for absolute permeability (k) is given by [Dullien 1979]:

$$k = \frac{\phi}{32\tau} d_{throat}^2 = \frac{\phi}{32\tau} \frac{d^2}{BTR^2}$$

where $\phi$ is porosity, $\tau$ is the diffusive tortuosity which is assumed to be equal to the hydraulic tortuosity $\tau_{hy}$, $d_{throat}$ is the pore-throat diameter, d is the pore-body diameter, and BTR is the body-to-throat ratio. Note there are no free parameters in the Carman-Kozeny prediction; the model only assumes that the pore space can be approximated by a parallel bundle of capillary tubes. Our invention uses modifications of the Carman-Kozeny equation to predict the permeability from NMR, which has a stronger physical basis than either the SDR or the Timur-Coates permeability models.

SUMMARY OF EMBODIMENTS

This is a new method for estimating the permeability (k) of an oil or gas formation using NMR restricted diffusion and relaxation data. This new method uses restricted diffusion measurements with multiple hydrocarbon fluids, such as C1 (methane) and C4 (butane), or, C1 and C10 (decane), and multiple diffusion lengths, in addition to the usual relaxation time ($T_2$) and porosity ($\phi$) measurements. The restricted diffusion measurement results in estimation of the pore-body size (d) from surface-to-volume ratio, and tortuosity ($\tau$). These, in addition to porosity ($\phi$), are key factors in estimating formation permeability. The invention comprises an equation based on the Carman-Kozeny model of a parallel bundle of capillary tubes, using established values for ratios of pore-body to pore-throats for known lithologies.

In planning the NMR restricted diffusivity measurements, we choose an optimum series of diffusion-encoding times ($t_\Delta$) for the pulse-field gradient (PFG) pulse sequence to obtain the correlation between the restricted diffusivity $D/D_0$ (where D is the measured diffusion coefficient, and $D_0$ is the diffusion of the bulk fluid) and the free diffusion length ($L_D = \sqrt{D_0 t_\Delta}$). On the $D/D_0$ vs. $L_D$ relation, the restricted diffusivity of C10 falls in the short $L_D$ region, thus determining surface-to-volume ratio and pore size d. On the $D/D_0$ vs. $L_D$ relation, at high-pressure C1 falls in the long $L_D$ region, thus determining tortuosity ($\tau$) in the asymptotic limit.

By applying the Padé fit to restricted diffusivity of these two hydrocarbons, we estimate the tortuosity ($\tau$) and pore-size (d) of the hydrocarbon-filled pore space. We compare our new invention to our previously published method fitting a Padé approximation curve to a suite of NGLs (natural gas liquids). We find that this invention improves logistics, robustness and accuracy.

Using the tortuosity ($\tau$), pore size (d), and porosity ($\phi$) occupied by the hydrocarbon fluids, and also making an estimate of pore-body to pore-throat ratio for a known lithology, we invent an equation for the permeability (k) of the mobile hydrocarbons in the core.

This method is used to determine the mobile hydrocarbon permeability ($k_X$) of core X for NMR core analysis. The invention discloses a new method of determining pore body-to-throat ratio (BTR) for the part of the pore size distribution occupied by the mobile hydrocarbons. This invention is most useful for determining the mobile hydrocarbon permeability ($k_{log}$) in the downhole NMR logging environment using a gradient-based NMR logging tool. A gradient-based NMR logging tool is required to obtain NMR diffusion measurements.

for an Austin chalk core at $S_{wirr}$ with C10($D_2O$) and $L_D$=4.9 µm. Filled symbols show the fitting region.

Figure 20:
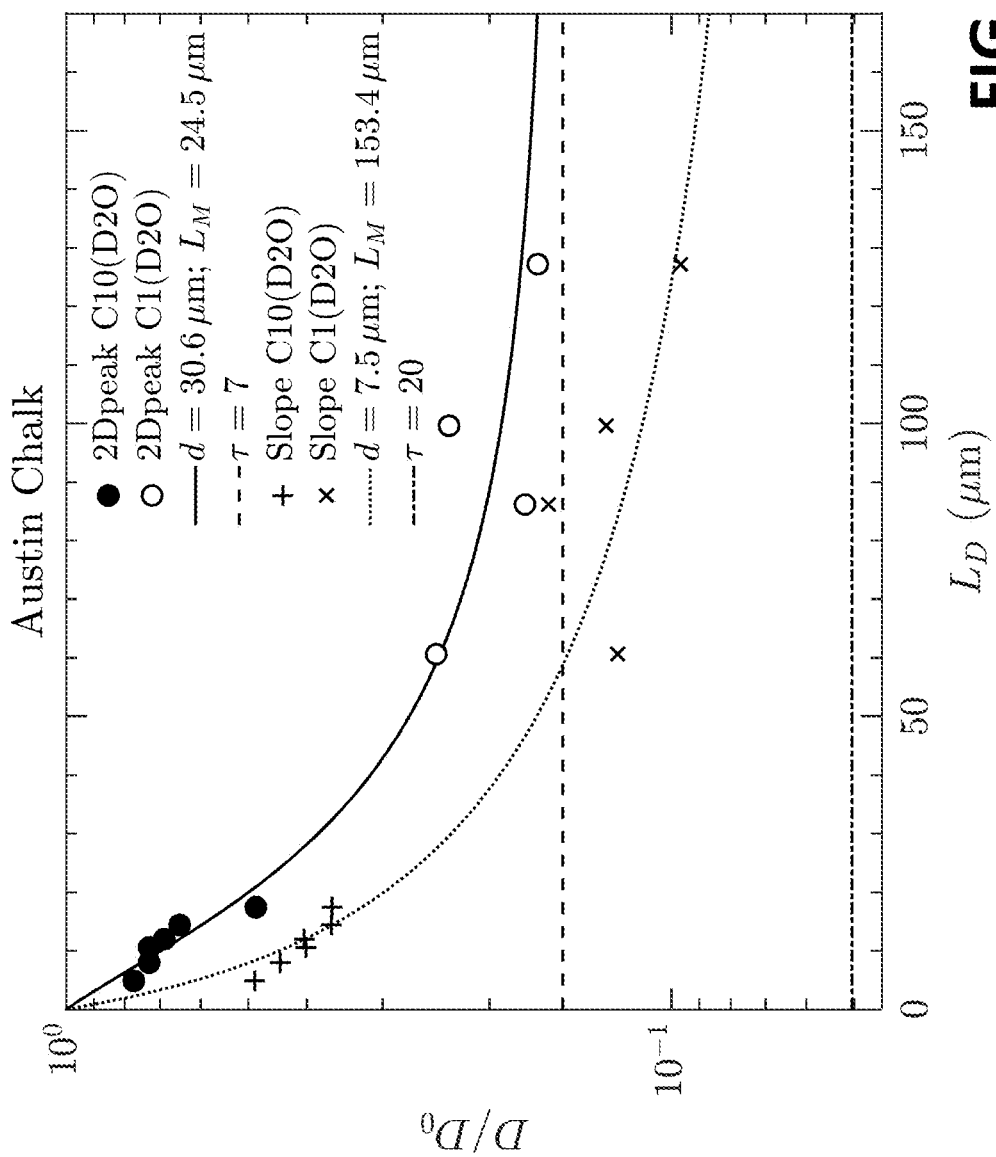

FIG. 20: Example of restricted diffusion $D/D_0$ versus $L_D$ determined by the 2D peak (i.e. mode) of the D-$T_2$ map versus the initial slope, and the resulting Padé fit, for an Austin chalk core at $S_{wirr}$ with C10($D_2O$) or C1($D_2O$).

Figure 21:
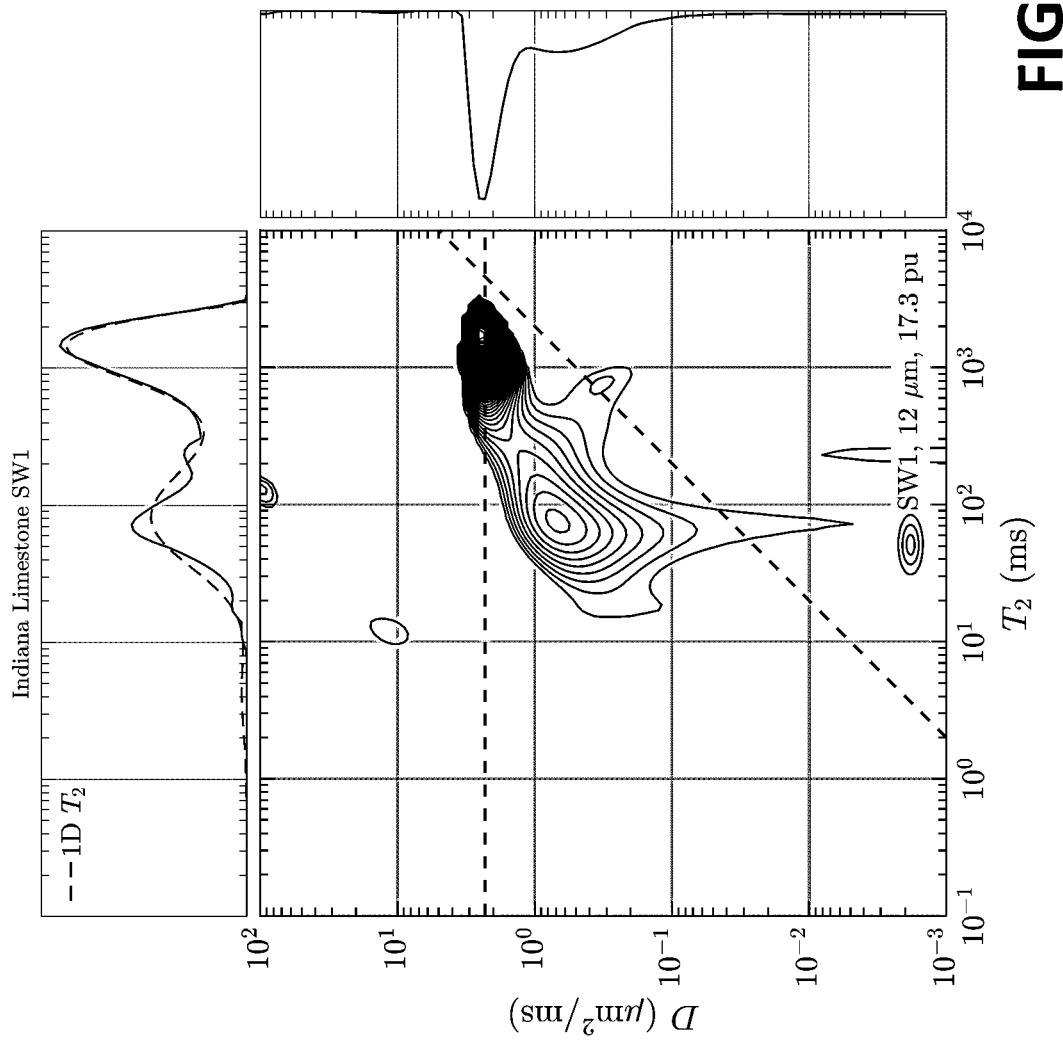

FIG. 21: D-$T_2$ correlation map of brine-saturated (SW1) Indiana Limestone.

Figure 22:
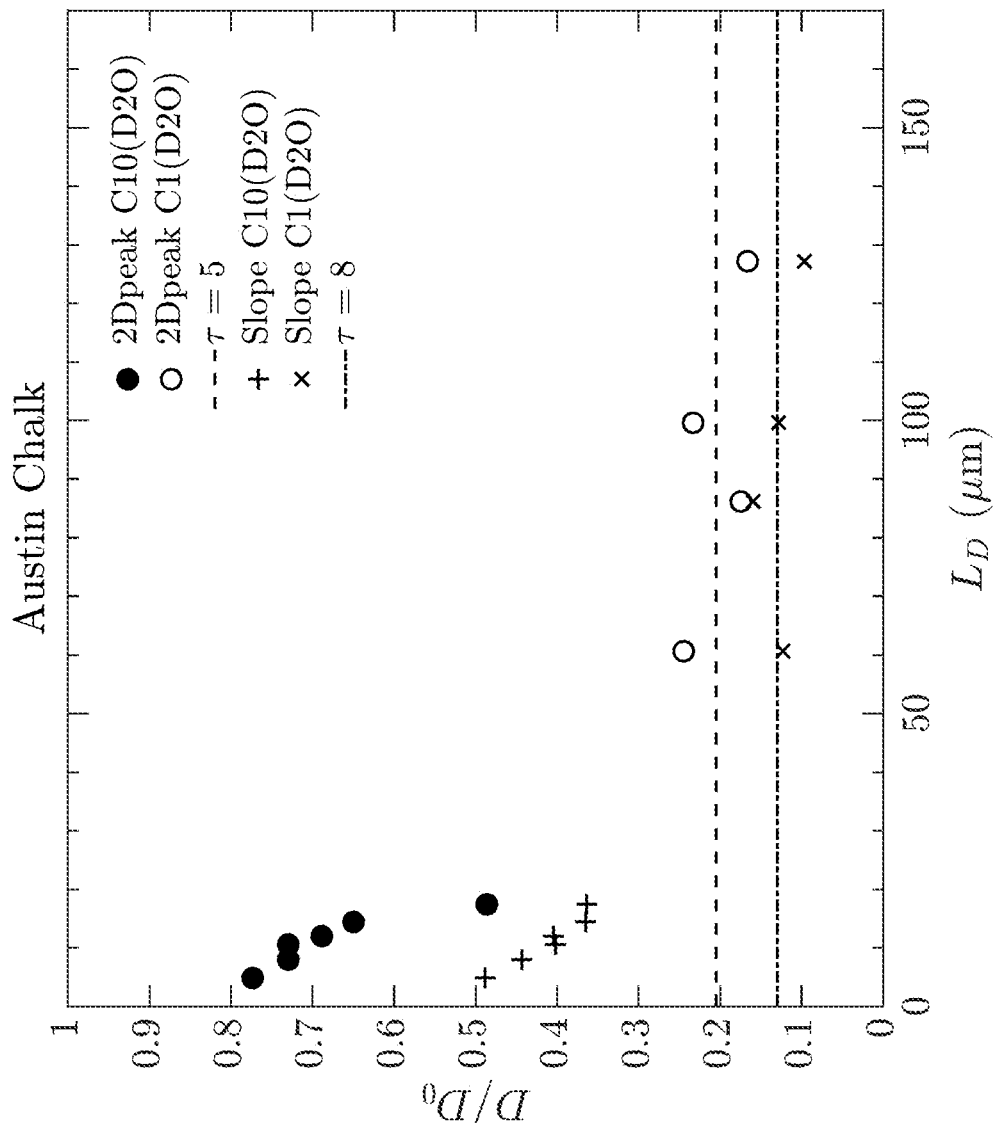

FIG. 22: Example of restricted diffusion $D/D_0$ versus $L_D$ determined by the 2D peak (i.e. mode) of the D-$T_2$ map or the initial slope, and the resulting average tortuosity determined from C1($D_2O$), for an Austin chalk core at $S_{wirr}$ with C10($D_2O$) or C1($D_2O$).

Figure 23:
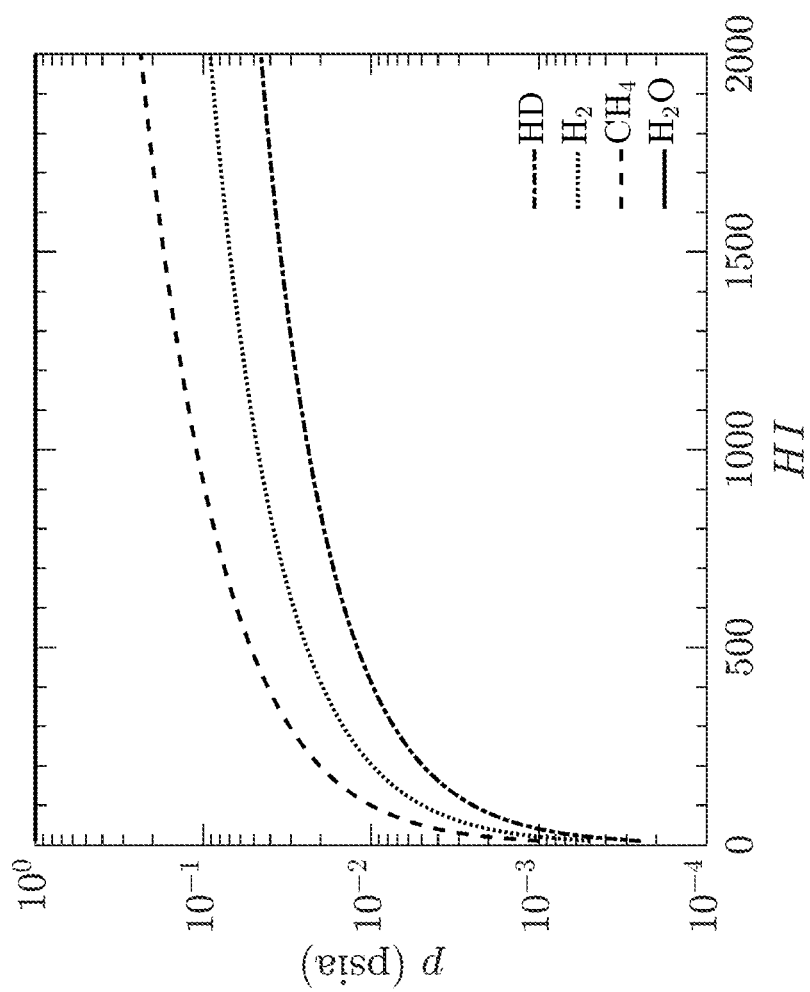

FIG. 23: Hydrogen Index (HI) comparison between water (unity), $CH_4$, $H_2$, and HD, all at 30° C. We assume HD and $H_2$ have the same molar density at a given pressure and temperature. The hydrogen indexes of fluids other than water are calculated by comparing the proton molar densities with that of water at the same temperature and pressure.

Figure 24:
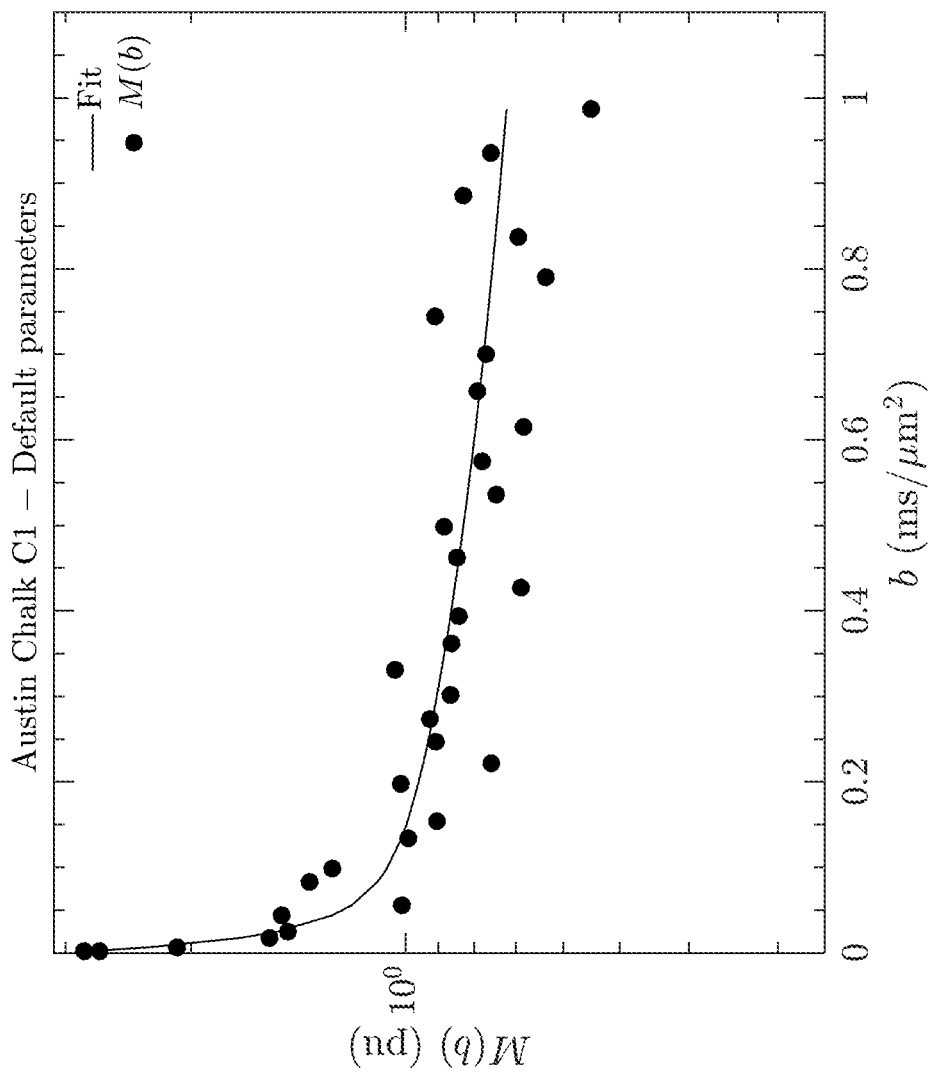

FIG. 24: Example of decay in magnetization M(b) due to diffusion encoding parameter $$b = q^2(t_\Delta - t_\delta/3 + \varepsilon)$$

where q=$\gamma t_\delta$G, for an Austin chalk core at $S_{wirr}$ with C1 using the default pulse-parameters in the table.

Figure 25:
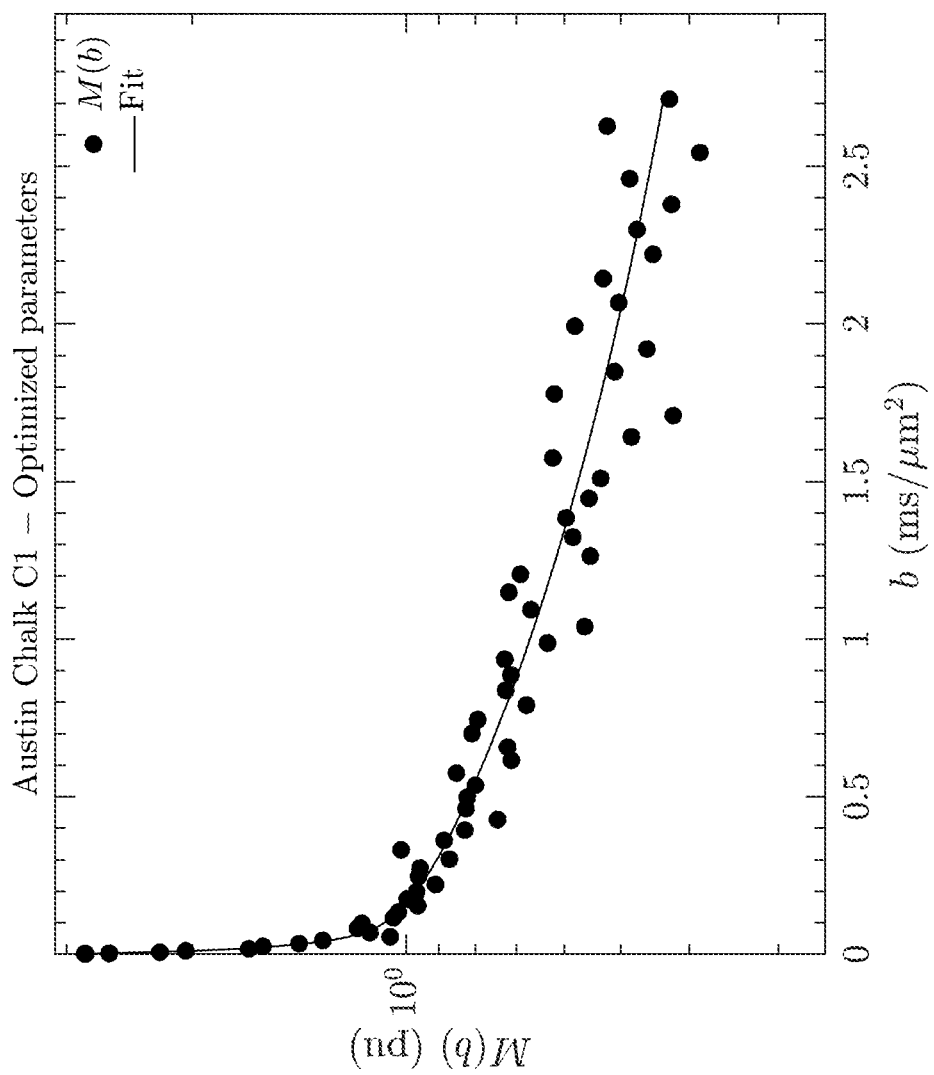

FIG. 25: Example of decay in magnetization M(b) due to diffusion encoding parameter $$b = q^2(t_\Delta - t_\delta/3 + \varepsilon)$$

where $$q = \gamma t_\delta G$$

for an Austin chalk core at $S_{wirr}$ with C1 using the optimized pulse-parameters in the table.

Figure 26:
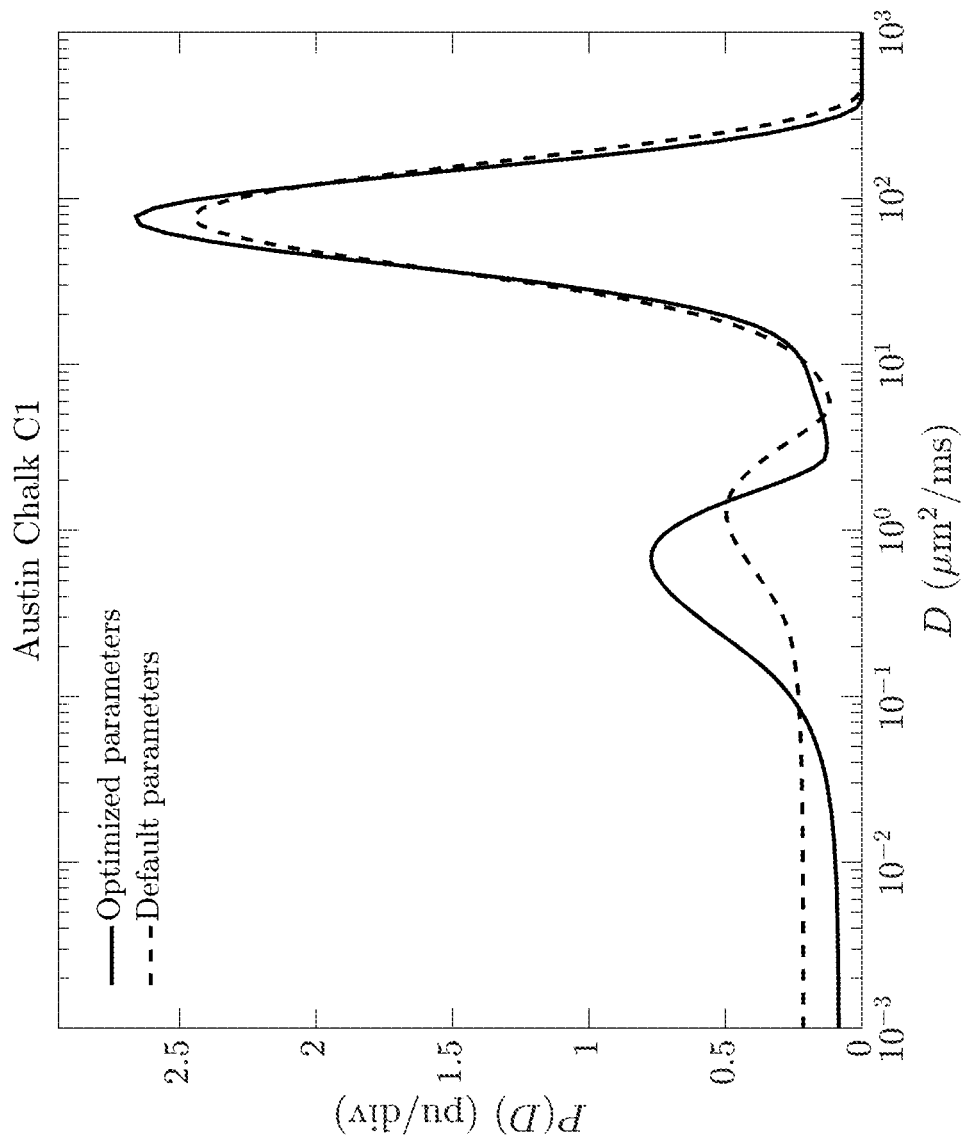

FIG. 26: Comparison of diffusion projection D using default versus optimal pulse sequence parameters.

Figure 27:
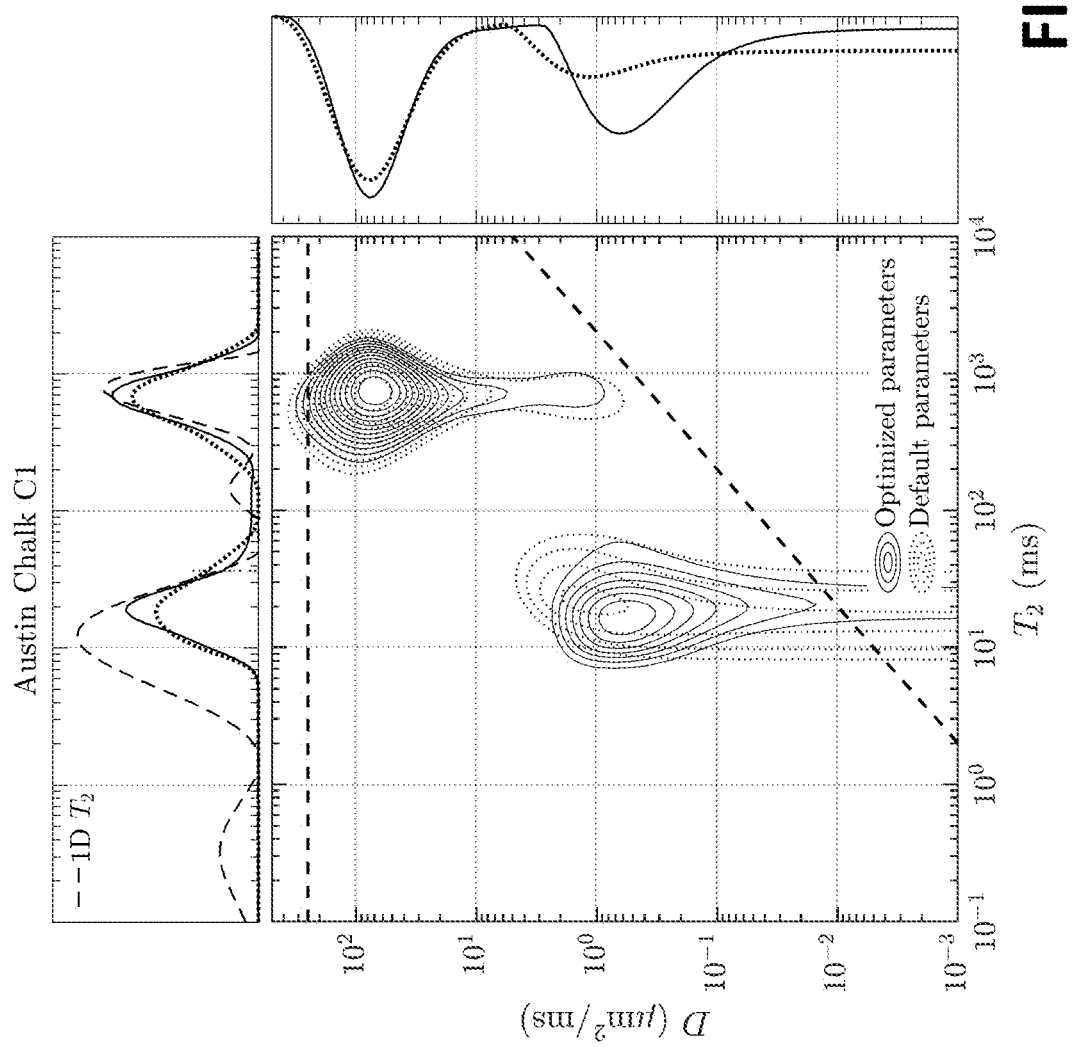

FIG. 27: Comparison of D-$T_2$ maps using default versus optimal pulse sequence parameters.

DETAILED DESCRIPTION OF EMBODIMENTS

Pore-Size and Tortuosity from NMR Diffusion-$T_2$ Measurements

In bulk fluid, the molecule diffuses with its bulk diffusivity ($D_0$). However, with the pore wall's restriction, the measured diffusivity (D) for the pore fluid will be smaller than the bulk diffusivity. As a result, the normalized restricted diffusivity ($D/D_0$) contains information about the geometry of the connected pore space, including tortuosity (τ) and pore size (d), which along with porosity (ϕ) are useful for estimating permeability.

In (Chen 2019, Chen 2019b, Wang 2020) we reported on the diffusive tortuosity and pore size of a low permeability unconventional organic-rich chalk formation at a depth of 920 m. NMR D-$T_2$ correlation maps of C10 and C1 saturated cores in the presence of connate water are used to determine d and τ in the hydrocarbon-bearing pore space, with connate water present in the micritic pores.

The Padé fit to the restricted diffusion (D/DO) data as a function of $L_D$ (measured over a large range from 5 μm to 166 μm) yields a tortuosity of τ=149 and a pore-body size of d=4.9 μm for the hydrocarbon-bearing pore space at a depth of 920 m. Error analysis shows ±4.3% accuracy for d and ±1.3% accuracy for τ based on 1% synthetic noise in the simulated measured diffusivity and diffusion-length data. Adding additional data from different hydrocarbons (C2, C3, C4, C5, each at a single $L_D$) indicates a ±10% change in d and a ±1% change in τ.

The same Padé fit as a function of $T_2$ agrees well with the D-$T_2$ map for C10, with surface relaxivity ρ=0.92 μm/s as the only additional parameter at a depth of 920 m. This agreement helps validate our technique, and most importantly allows for the invention to be used on downhole logs where one cannot change the hydrocarbon-bearing pore space with different fluids.

Experimental

The equation (Tanner, 1970; Mitchell et al., 2014) which describes the magnetization decay after applying the Unipolar Stimulated-Echo pulse sequence is:

$$M(q, nt_E) = \sum_{D,T_2} e^{-nt_E/T_2} e^{-q^2(t_\Delta - t_\delta)/3+\varepsilon)D} P(D, T_2) \Delta_D \Delta_{T_2}$$

where q=γG$t_δ$ is the wavevector for diffusion encoding, γ/2π=42.57 MHz/T is the gyro-magnetic ratio for $^1$H, $\varepsilon=\epsilon^3/30t_\delta^2 - \epsilon^2/6t_\delta$ is the (small) effect of the ramp time for the gradient pulses, and n is the echo number. P(D, $T_2$) is the probability density function (i.e. D-$T_2$ map) normalized as such $\Sigma_{D,T_2}$ P(D, $T_2$) $\Delta_D \Delta_{T_2} = \phi_{DT_2}$, where $\phi_{DT_2}$ is the total porosity from D-$T_2$, and the constants $\Delta_D = \log_{10}(D_{i+1}) - \log_{10}(D_i)$, and $\Delta_{T_2=log}\log_{10}(T_{2,i+1}) - \log_{10}(T_{2,i})$ are the logarithmic bin spacings of the 2D map. The porosity $\phi_{DT_2}$ is typically less than the total porosity $\phi_{T_1T_2}$ from $T_1$-$T_2$ maps due to $T_1$ and $T_2$ decay during the dead time $t_D$ (see FIG. 1) as such:

$$\phi_{DT_2} = \sum_{T_1,T_2} e^{-2\tau_{se}/T_2} e^{-(t_\Delta - \tau_{se})/T_1} p(T_1, T_2) \Delta_{T_1} \Delta_{T_2}$$

where P($T_1$, $T_2$) is the probability density function i.e. the $T_1$-$T_2$ normalized as $\Sigma_{T_1,T_2}$ P($T_1$, $T_2$) $\Delta_{T_1}\Delta_{T_2} = \phi_{T_1T_2}$. Partial compensation of the loss in the signal from D-$T_2$ can be recovered (numerically) by boosting the P(D, $T_2$) map as such:

$$P_B(D, T_2) = P(D, T_2) B(T_2)$$

where the boosting factor B($T_2$) at each $T_2$ bin is:

$$B(T_2) = \min\{e^{2\tau_{se}/T_2} e^{(t_\Delta - \tau_{se})/T_{1LM}}, 3\}$$

$T_{1LM}(T_2)$ is defined as the log-mean $T_{1LM}$ at each $T_2$ bin, which can be computed from P($T_1$, $T_2$). In cases where P($T_1$, $T_2$) data is not available, one can use a fixed $T_1$=1.5 $T_2$, i.e. a constant $T_1/T_2$=1.5, for instance. The amount of boosting to B($T_2$)≤3 is limited to avoid boosting noise in the P(D, $T_2$) map below $T_2 < T_{2,Dcut}$. In the case of a dead time of $t_D$=25 ms, a boosting limit of 3 corresponds to $T_{2,Dcut}$≈7 ms, where P(D, $T_2$) is mostly noise below $T_2 < T_{2,Dcut}$.

TABLE 1

| ε (ms) | $t_δ$ (ms) | $τ_{se}$ (ms) | $t_Δ$ (ms) | $t_D$ (ms) | G (G/cm) | $t_E$ (ms) |
|---|---|---|---|---|---|---|
| 0.2 | 9.0 | 10 | 15 ⇔ 110 | 25 ⇔ 120 | 0 ⇔ 43 | 0.2 |
| $\phi_1$ | | | | | 0202020213131313 | |
| $\phi_2$ | | | | | 0022002200220022 | |
| $\phi_3$ | | | | | 0000222200002222 | |
| $\phi_4$ | | | | | 1111111100000000 | |
| $\phi_5$ | | | | | 2002022013313113 | |

Top: D-$T_2$ pulse parameters defined in FIG. 1. Not listed is the spoiler gradient pulse (during the $T_1$ decay portion) of duration 1 ms and strength 1 G/cm.
Bottom: RF phases $\phi_{1,2,3,4,\alpha}$ defined in multiples of π/2 (i.e. a value of "3" corresponds to a phase of 3π/2).

Note that the boost B($T_2$) does not affect the mode of the P(D, $T_2$) map in region C, as such the results to the Padé fit shown below are not affected.

Figure 1:
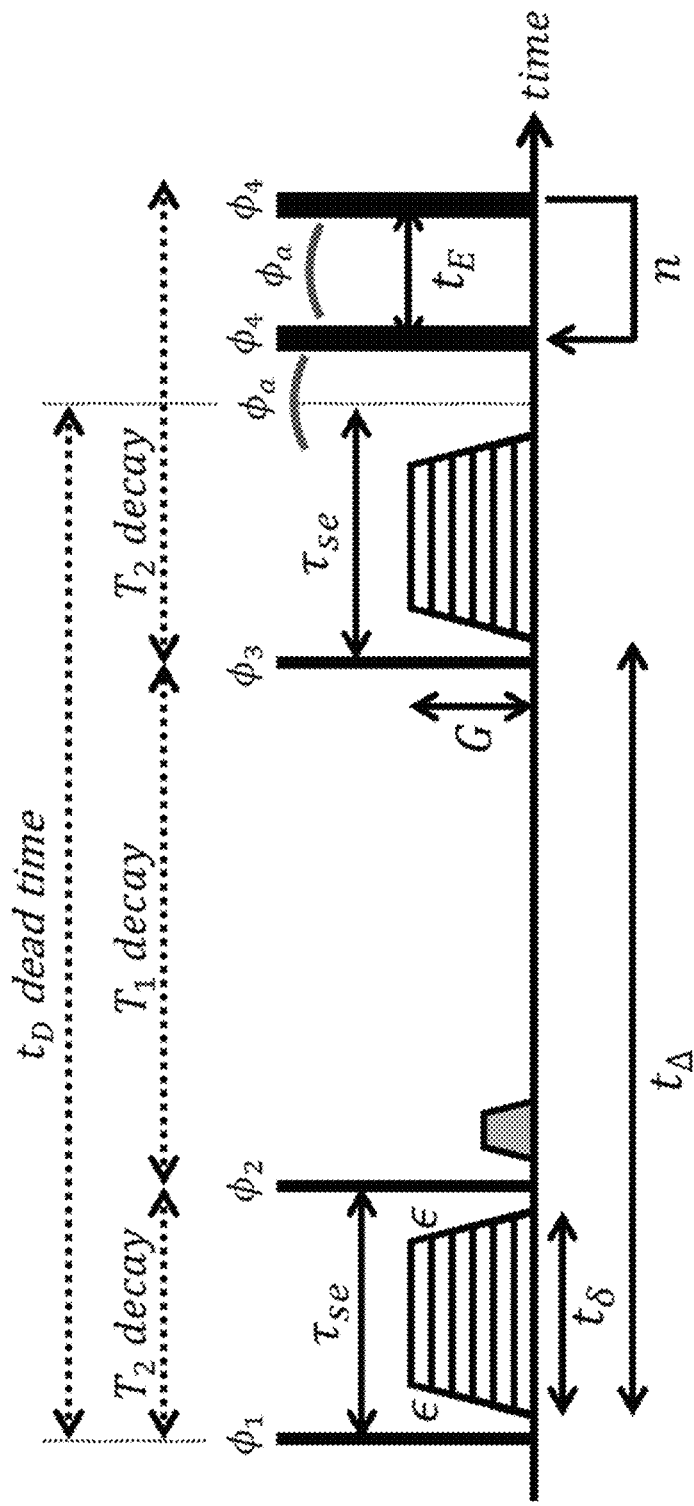
FIG. 1: Diffusion-$T_2$ (a.k.a. D-$T_2$) unipolar stimulated-echo pulse sequence (Tanner 1970, Mitchell 2014) used to measure restricted diffusion as a function of diffusion time $t_\Delta$. Trapezoidal gradient encoding pulses G (green) are shown with duration $t_\delta$ (time from half-height to half-height) and ramp-time $\in$, along with 90° (thin) and 180° (thick) RF pulses (blue) of phase $\phi_{1,2,3,4,a}$, and CPMG echo trains with echo-spacing $t_E$. Not shown is a set of 6 "woodpecker" gradient pulses to stabilize the Eddy currents before the first RF pulse.

The unipolar stimulated-echo pulse sequence developed by Tanner 1970, shown in FIG. 1, has 7 intervals of diffusion encoding, with default parameters listed in Table 1. Another pulse sequence often used in porous media is the bipolar stimulated-echo sequence developed by Cotts et al. 1989, which has 13 intervals of diffusion encoding. While the "Cotts 13" sequence is more complex to implement than the "Tanner 7" sequence, the Cotts 13 sequence greatly reduces the effects of internal magnetic field gradients in porous media. Internal gradients can distort the diffusion measurement, especially at high magnetic fields, and especially for porous media with large amounts of paramagnetic impurities, such as sandstones. Other variations exist such as the "Cotts 17" sequence etc., which can also be used.

A Geospec2 rock-core analyzer by Oxford Instruments was used to make the NMR measurements. A frequency of 2.3 MHz for $^1$H was used, which is similar to the NMR downhole logging tools. An Oxford NMR overburden cell was used for high-pressure saturation measurements. The NMR spectrometer is equipped with both a radiofrequency probe as well as a gradient coil for making diffusion measurements.

1D $T_2$ were acquired using CPMG (Carr-Purcell-Meiboom-Gill) pulse sequences with echo spacing of $t_E$=0.2 ms. NMR 2D D-$T_2$ data were acquired using the unipolar stimulated-echo sequence shown in FIG. as a function of diffusion evolution time $t_\Delta$. The inversion algorithm (Venkataramanan et al., 2002) is used to generate $T_2$ distributions and D-$T_2$ maps.

Twin core plugs were taken from a well in the Golan Heights in northern Israel at a depth of 920 m, corresponding to the late Cretaceous upper Ghareb formation. Detailed information about the core samples can be found in the (Chen et al., 2019), including the core plug and well information. The core-plug diameters are 25 mm and the lengths are 48 mm, which are suitable for the NMR overburden cell.

Figure 2:
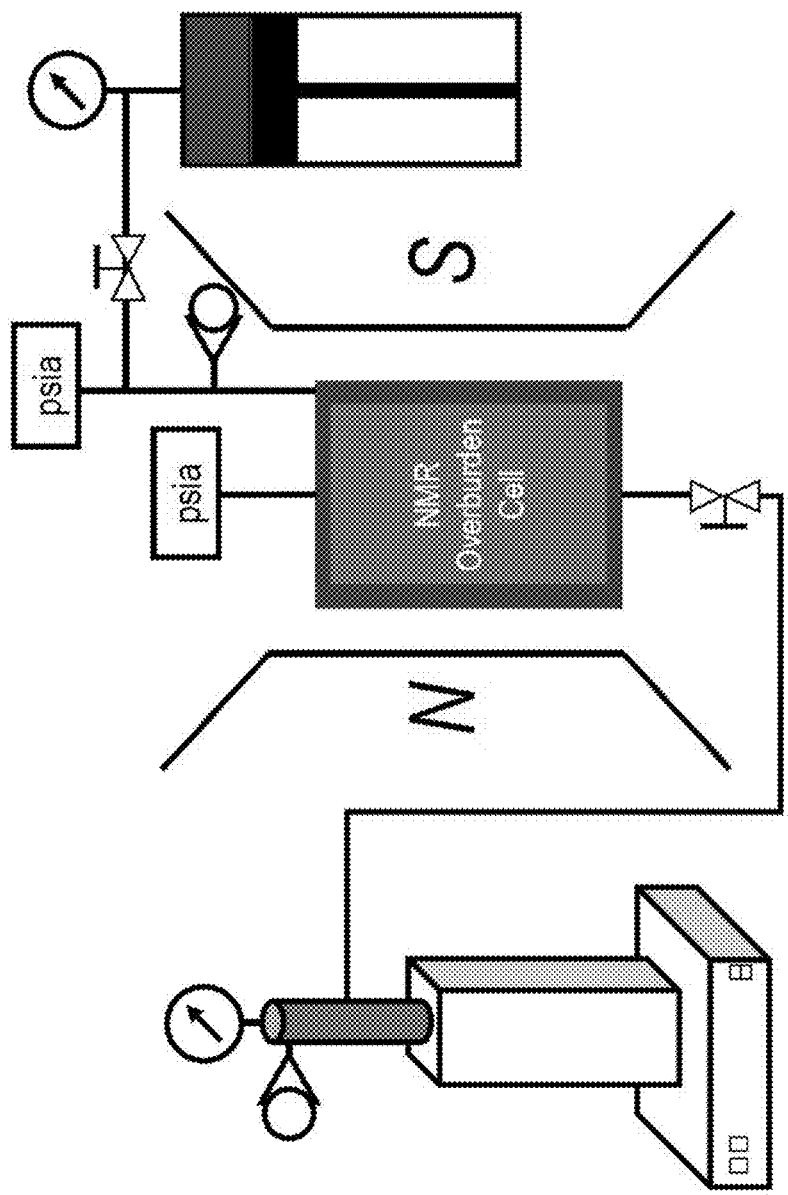
FIG. 2: A schematic of the NMR spectrometer with laboratory apparatus for fluid saturation used in this invention.

An ISCO pump shown in FIG. 2 was used to inject the hydrocarbon, and a hand pump was used to maintain a net overburden pressure of 1000 psi. The pore pressure was 1200 psia and the spectrometer temperature 30° C. Heat shrink (PTFE) tubing was used to separate the core and the confining fluid. The end piece of the NMR core holder was made of PEEK (polyether ether ketone), which has minimal NMR signal at $t_E$=0.2 ms.

Figure 3:
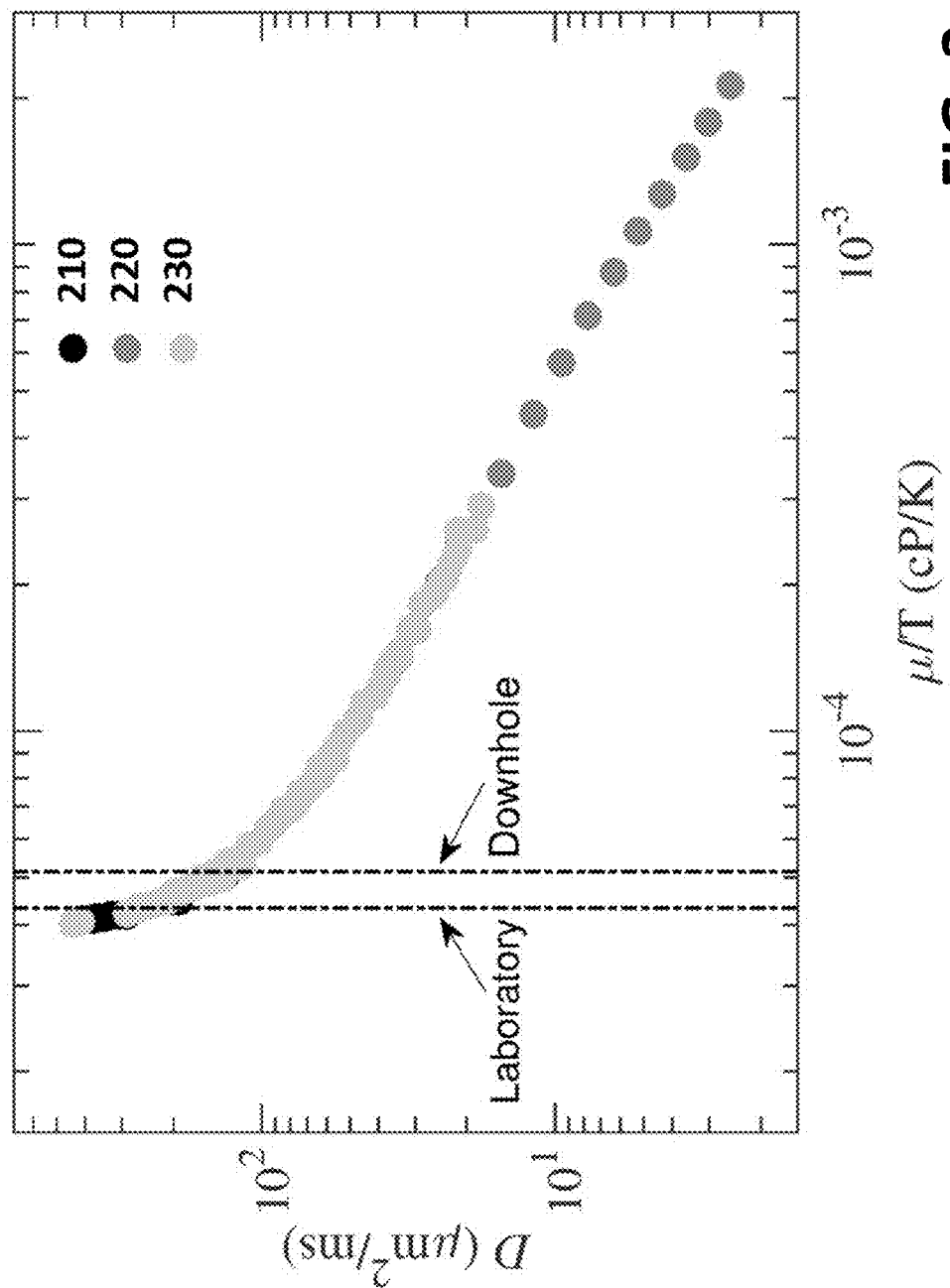
FIG. 3: The bulk diffusivity D vs. viscosity/temperature $\mu/T$ of C1 (methane).

The bulk properties of hydrocarbon are shown in Table 2. Viscosity and density are obtained from the REFPROP NIST database. The HI (NMR Hydrogen Index) was calculated based on the density and the amount of hydrogen in each molecule. Diffusivity of C1 is from Chen et al., 2019 shown in FIG. 3.

TABLE 2

Bulk properties of water and hydrocarbons under the experimental conditions.

| Fluid | Experiment conditions: 30° C., 1200 psia | | |
|---|---|---|---|
| | HI | Viscosity (cP) | Diffusivity ($\mu m^2/ms$) |
| Water ($H_2O$) | 1.00 | 0.797 | 2.3 |
| Methane (C1) | 0.13 | 0.013 | 250 |
| Decane (C10) | 1.02 | 0.869 | 1.6 |

The as-received core contains connate water. As such the C10 saturated core contained both C10 and connate water. A twin core was used for C1 saturation, which was pretreated with $D_2O$ brine (8000 ppm NaCl $D_2O$ brine solution) before C1 saturation to avoid interference from water signal; this core was labeled C1($D_2O$).

$T_2$ Distributions

Figure 4:
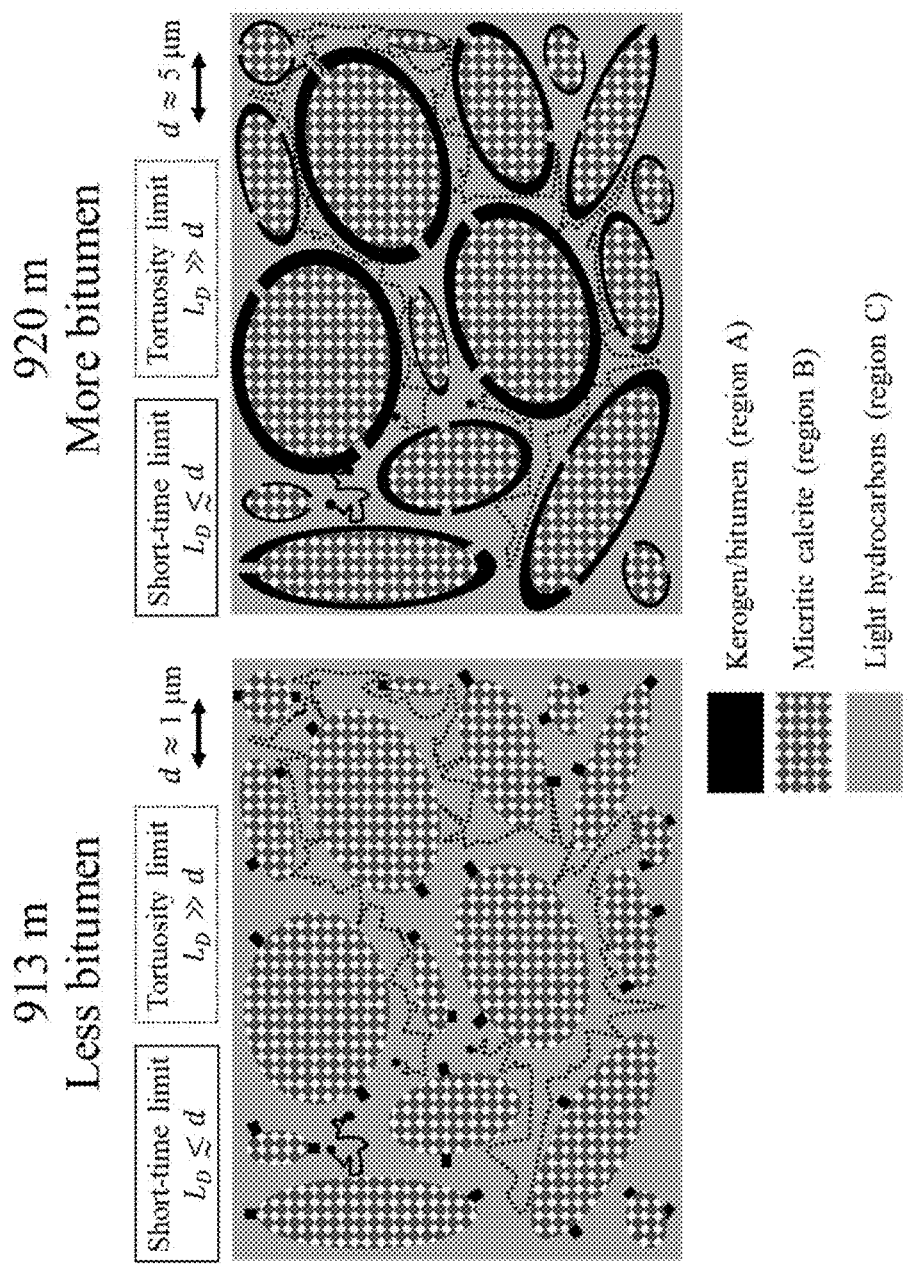
FIG. 4: Illustration of a random walk of a light hydrocarbon molecule in the core sample used in this study, in the short-time limit and the tortuosity limit, at 913 m and 920 m.
Figure 5:
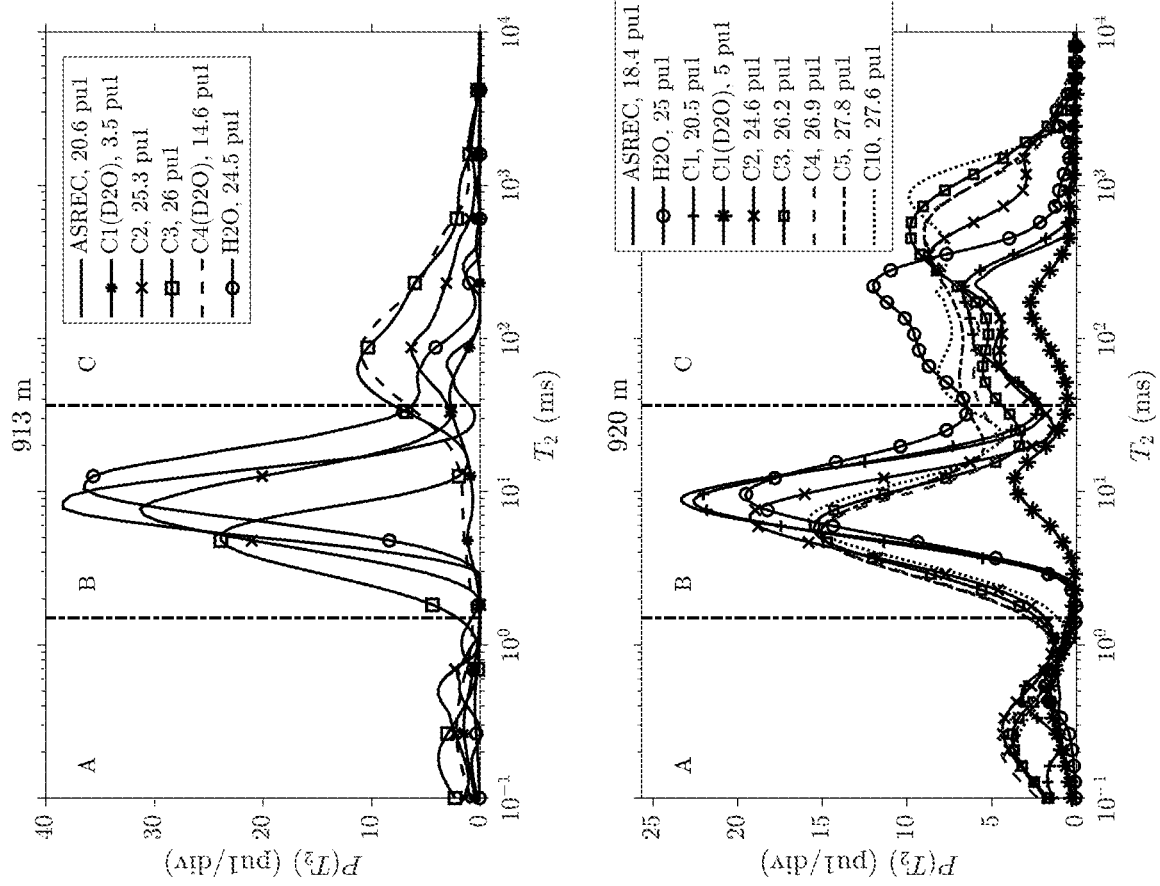
FIG. 5: $T_2$ distribution of the as-received (ASREC), decane saturated (C10), methane-saturated deuterated core C1($D_2O$), and deuterated core ($D_2O$), top is (913 m) and bottom is (920 m). "pu1" means assuming the HI=1.

The rock matrix mainly consists of calcite and kerogen, which are not detected by our NMR measurements. The detectable $T_2$ range is separated into three regions, A, B and C as shown in FIG. 4 and FIG. 5. FIG. 4 is the illustration of the core sample. Region A (0.2 ms⇔3 ms) is mainly comprised of bitumen. During the hydrocarbon saturation, the bitumen's viscosity decreases due to hydrocarbon dissolution, which will make the bitumen relax slower, and become more detectable (Singer et al., 2016; Chen et al., 2017). Region B (3 ms⇔37 ms), which is the micropore region, is mainly comprised of the micritic calcite. Region B contains the connate water in the reservoir with unknown composition. Region C (>37 ms) is comprised of light hydrocarbon and some connate water. Region B is water wet and region C is mix-wet (Chen et al., 2019). During the saturation, some water in the region C is replaced by hydrocarbon. When the diffusion time is short ($L_D < d_p$) the diffusion is less restricted. When the diffusion time becomes longer ($L_D \gg d_p$), molecules travel to more areas. When the time becomes long enough, the restricted diffusion will approach the limit $D_\infty$.

The restricted diffusivity of C10 lies in the short diffusion-length regime ($L_D < d_p$), which determines the surface-to-volume ratio S/V and pore-body size $d_p$. The restricted diffusivity of high-pressure C1 lies in the long diffusion-length regime ($L_D \gg d_p$), which determines the tortuosity $\tau$.

For each saturation state, C10 or C1($D_2O$), multiple $t_A$ is used in the pulse sequence in order to measure diffusivity at multiple values of $L_D$, thereby improving the accuracy of pore-body size $d_p$ and tortuosity $\tau$ from the Padé fit.

FIG. 5 shows the $T_2$ distributions at 913 m (core contains less bitumen) and at 920 m (core contains more bitumen). Region C is mainly comprised of hydrocarbon-filled space, which is the region of interest for mobile hydrocarbons. Region C is mainly hydrocarbon saturated, with some connate water. At higher hydrocarbon viscosity (C10 or C4), we expect some of the connate water to be driven out in region C during saturation. We choose region C as the representative NMR porosity in region C since there is little or no diffusion coupling with the connate water in region B. The porosity in region C is found to be 14.6 pu at 913 m, and 13.0 pu at 920 m, i.e. they are comparable. The slightly larger region C porosity at 913 m may be due to there being less bitumen present than at 920 m (see FIG. 5).

Tortuosity is impacted by the hydrocarbon-filled porosity in region C. Hence to properly study the tortuosity of region C, at 920 m the C1 and C10's saturation in region C should be the same. After adjusting for HI=0.13 of C1, the C1 porosity in region C is ~12 pu which is similar to C10 (13.0 pu), and therefore gives confidence in our value of tortuosity.

Region B mostly contains connate water. At 920 m the peak $T_2$ value (i.e. mode) for C10 region B is shorter than the "as-received". One hypothesis is that C10 replaces some connate water in region B, thereby reducing the connate water in region B and increasing S/V for connate water. Another observation is that NMR porosity in region B for C10 at 920 m is less than as received "ASREC". This is because the C10 that entered the micritic pore has slower surface relaxation than brine, and therefore its NMR signal appears in region C.

The shorter $T_2$ values in region C for 913 m are due to smaller pores and/or larger surface relaxivity than for 920 m.

D-$T_2$ Correlation Map

D-$T_2$ measurements (FIG. 6 and FIG. 7) were optimized to get the restricted diffusion information of the hydrocarbon in the region C. Diffusion-$T_2$ (a.k.a. D-$T_2$) unipolar stimulated-echo pulse sequence is used to encode the diffusion information into the magnetization decay. After applying a 2D inversion (Venkataramanan et al., 2002), D-$T_2$ map is acquired to correlate diffusion and $T_2$.

Figure 6:
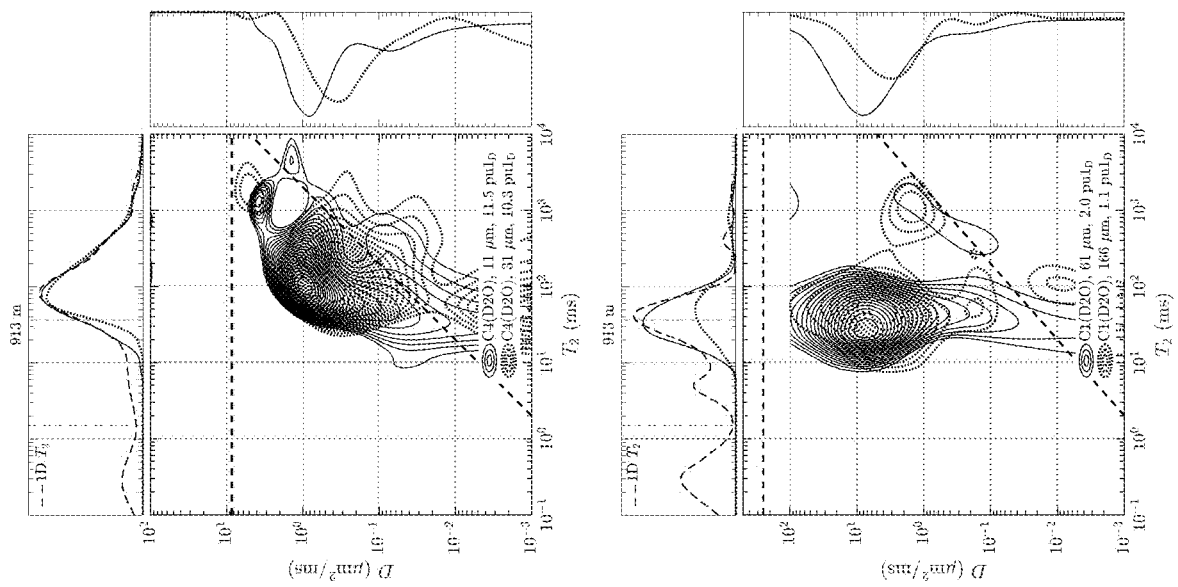
FIG. 6: D-$T_2$ correlation map of the C4($D_2O$) and C1($D_2O$) saturated core at 913 m.

FIG. 6 shows two representative D-$T_2$ maps for C4(D2O) and C1(D2O) at 913 m. The y-axis is the restricted diffusivity and the x-axis is the $T_2$. The porosity is displayed perpendicular to the page, which is shown as contours. The dashed horizontal line represents the bulk diffusivity, which for C1 (250 $\mu m^2/ms$) is out of range of the plot. The oil correlation time (Lo et al., 2002), is shown in the diagonal dash line. Each plot overlays D-$T_2$ measurements for the same saturated core but with different diffusion lengths listed in the legend. The subplots on the top and right are the $T_2$ and diffusion projections, respectively. In the top subplot, dashed lines are 1D $T_2$ distributions from CPMG, and solid lines are from D-$T_2$ projection. Porosity shown in the legend is the total porosity from 1D $T_2$ measurement and "pu1" means assuming the HI=1.

Figure 7:
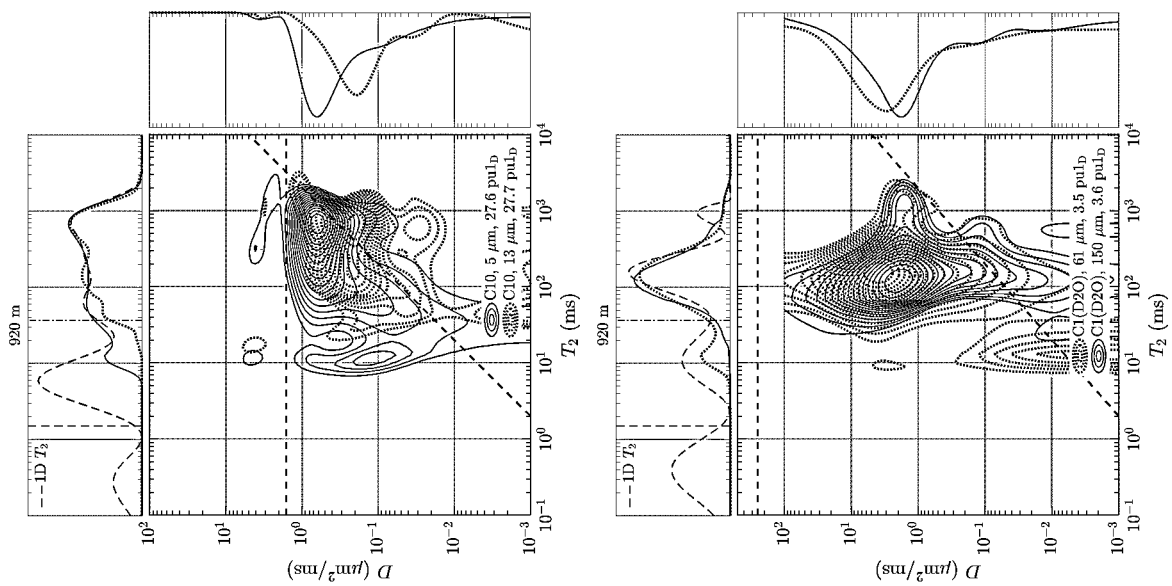
FIG. 7: D-$T_2$ correlation map of the C10 and C1 saturated core at 920 m.
Figure 8:
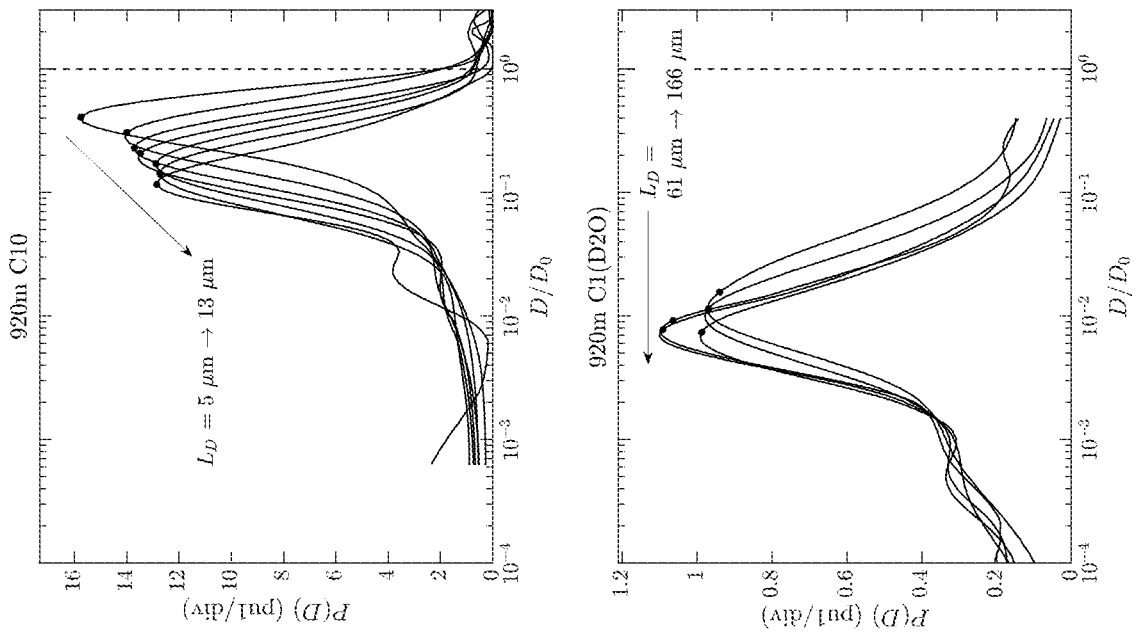
FIG. 8: Diffusion projections from D-$T_2$ correlation map of the C10 and C1 saturated core at 920 m, normalized to bulk diffusion, with the 2D peak values shown as the data points.

The restricted diffusion phenomenon is observed in both C4 and C1. Restricted diffusion will change with diffusion length for each hydrocarbon. Different diffusion lengths $L_D$ are acquired by changing the diffusion evolution time $t_A$ in the pulse parameter setting. D-$T_2$ measurements lose all the region A's signal, and lose most of the region B's signal, due to finite diffusion encoding dead time. The $T_2$ distribution in region C from the D-$T_2$ map matches the 1D $T_2$ measurement in region C (>37 ms). To retrieve the restricted diffusion information of the hydrocarbons, the 2D peak value (i.e. the mode) from the D-$T_2$ maps is selected. FIG. 7 shows C10 and C1(D2O) at 920 m (more bitumen), which shows similar trends. For completeness, FIG. 8 shows the diffusion projections from FIG. 7, normalized to bulk diffusion, with the 2D peak values shown as the data points.

Padé Fit

The restricted diffusion is a function of bulk diffusivity ($D_0$) of the molecule, diffusion time ($\tau_A$), surface-to-volume ratio (S/V) of the pore, heterogeneity length-scale ($L_M$), and diffusive tortuosity ($\tau$) (Latour et al., 1993). The Padé equation describes the relation between these variables (Hurlimann et al., 1994) as such:

$$\frac{D}{D_0} = 1 - \left(1 - \frac{1}{\tau}\right) \frac{\frac{4}{9\sqrt{\pi}} \frac{S}{V} L_D + \left(1 - \frac{1}{\tau}\right) \frac{L_D^2}{L_M^2}}{\frac{4}{9\sqrt{\pi}} \frac{S}{V} L_D + \left(1 - \frac{1}{\tau}\right) \frac{L_D^2}{L_M^2} + \left(1 - \frac{1}{\tau}\right)}$$

Where the diffusion length is defined as:

$$L_D = \sqrt{D_0 t_\Delta}$$

If assuming cylindrical geometry of diameter d:

$$\frac{S}{V} = \frac{2}{r} = \frac{4}{d}$$

the Padé equation then reduces to:

$$\frac{D(L_D)}{D_0} = 1 - \left(1 - \frac{1}{\tau}\right) \frac{\frac{16}{9\sqrt{\pi}} \frac{L_D}{d} + \left(1 - \frac{1}{\tau}\right) \frac{L_D^2}{L_M^2}}{\frac{16}{9\sqrt{\pi}} \frac{L_D}{d} + \left(1 - \frac{1}{\tau}\right) \frac{L_D^2}{L_M^2} + \left(1 - \frac{1}{\tau}\right)}.$$

Figure 9:
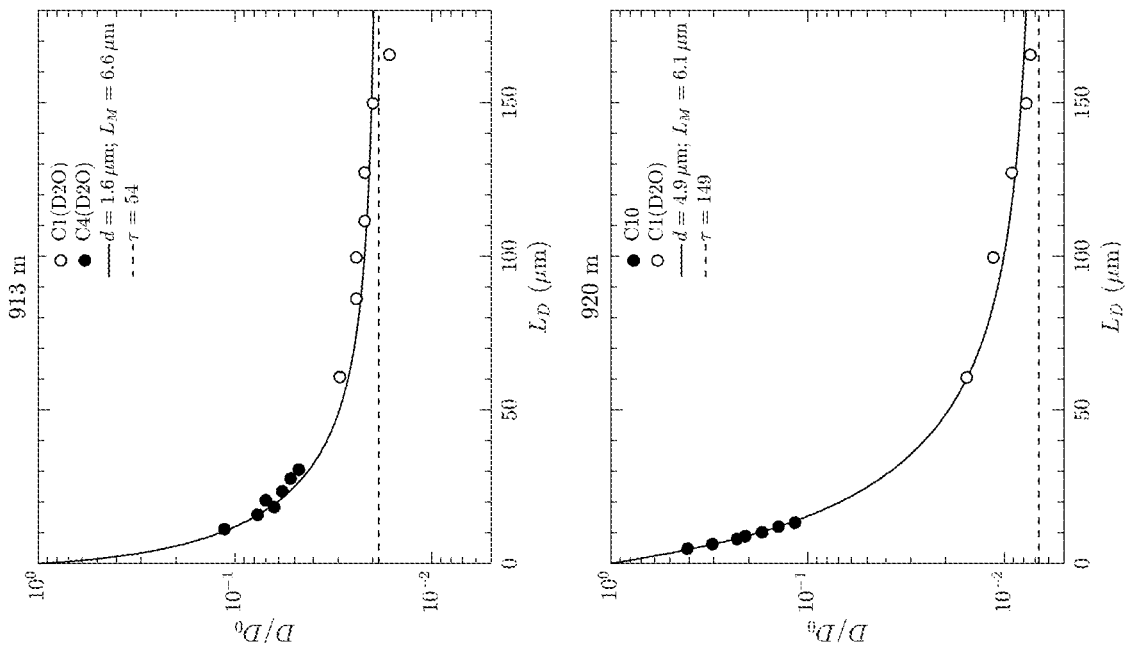
FIG. 9: Diffusion length ($L_D$) against normalized restricted diffusivity ($D/D_0$). The dots are the points from the 2D peak of the D-$T_2$ maps in the region C. Top: C4($D_2O$) and C1($D_2O$) are shown for 913 m. Bottom: C10 and C1($D_2O$) are shown for 920 m. The solid black line is the best fit using the Padé equation. The dashed horizontal line shows the tortuosity limit. To do the parameter estimation, non-linear curve-fitting (lsqcurvefit) in MATLAB is applied. The loss function is the minimum square error on a log scale.

FIG. 9 shows the best Padé fit using the C4(D2O) and C1(D2O) restricted diffusivity at 913 m, and C10 and C1(D2O) at 920 m. C4 and C10 lies in the short diffusion length region, which is sensitive to pore-body size; C1(D2O) lies in the long diffusion length region which is sensitive to tortuosity. Compared with our previous study (Chen et al. 2019) where the largest $L_D$ was 60 μm, FIG. 9 provides a much more accurate tortuosity since $L_D$ is increased up to 166 μm.

We note that the gap in $L_D$ between C1 and C10, or between C1 and C4, in FIG. 9 can be closed by using C1 at higher pressure. The higher pressure will decrease the bulk diffusion $D_0$, which will in term reduce the $L_D$ and close the gap.

According to the Padé Equation Eq. (5), $T_2$ and restricted diffusivity are correlated since $T_2$ is a function of S/V. As such, the Eq. (5) can be converted to a curve on the D-$T_2$ map. First, the surface relaxivity ρ is calculated using d from FIG. 9 and $T_{2B}$ as such:

$$\rho = \left(\frac{1}{T_2} - \frac{1}{T_{2B}}\right) \frac{V}{S} = \frac{1}{T_{2S}} \frac{d}{4}$$

where $T_2$ is taken at the mode of region C in FIG. 5, and $T_{2S}$ is the surface relaxation at the mode of region C. The Padé fit can then be plotted on the D-$T_2$ map using the following equation (Zielinski et al., 2010):

$$\frac{D(T_2)}{D_0} = 1 - \left(1 - \frac{1}{\tau}\right) \frac{\frac{4}{9\sqrt{\pi}} \frac{L_D}{\rho T_{2S}} + \left(1 - \frac{1}{\tau}\right) \frac{L_D^2}{L_M^2}}{\frac{4}{9\sqrt{\pi}} \frac{L_D}{\rho T_{2S}} + \left(1 - \frac{1}{\tau}\right) \frac{L_D^2}{L_M^2} + \left(1 - \frac{1}{\tau}\right)}$$

using the best fit values of $L_M$ and T from FIG. 9. In other words, Eq. (14) is the Padé equation as a function of $T_2$ (i.e. pore-size) for a fixed $L_D$, while Eq. (8) is the Padé equation as a function of $L_D$ for a fixed pore-size d. Both forms of the Padé equation are equivalent.

Figure 10:
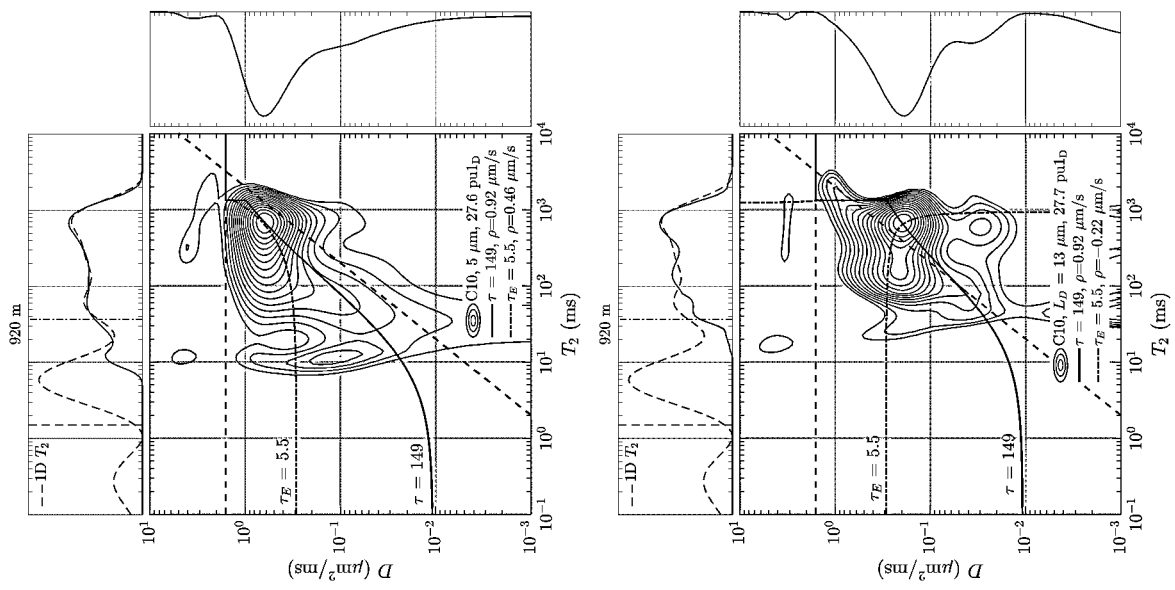
FIG. 10: Padé fit in Eq. (14) plotted on the D-$T_2$ map for C10 where $L_D$=5 µm, $T_{2B}$=1.33 s, $L_M$=6.1 µm, τ=149, and ρ=0.92 µm/s. Also shown is the (poor) result using the electrical tortuosity instead $\tau_E$=5.5, and ρ=0.46 µm/s. Table 3: Fixed parameter settings in the error analysis.

FIG. 10 at short diffusion length ($L_D$=5 μm) shows the comparison between the Padé equation and the D-$T_2$ correlation map for C10. As expected, the Padé curve shows good agreement with the hydrocarbon-bearing zone in region C, while it starts to deviate from the micritic water signal in region B. This agreement helps validate this technique. Note how using the lower electrical tortuosity ($\tau_E$) instead results in a poor fit to the hydrocarbon region, which justifies our invention. In the case of longer diffusion length $L_D$=13 μm) in FIG. 10, the electrical tortuosity fails since it yields unphysical ρ (i.e. a negative value), which further justifies our invention.

The same analysis can be done for C4(D2O) for the core sample from 913 m, however the bulk $T_{2B}$ value was not available for C4, which is most likely dominated by dissolved oxygen.

As shown below in the various methods of performing the invention, the Padé fit to D-$T_2$ maps is used on NMR logs and core to determine pore-size d, with known $L_M$ and τ.

Uncertainties

As shown above, the Padé equation can be used to retrieve the pore-body size and tortuosity from NMR restricted diffusivity data. To calculate the error propagation in this regression, the Padé equation is used as the underlying equation to generate simulated normalized restricted diffusivity. The fixed parameters are chosen in Table 3:

TABLE 3

| Fixed parameter settings in the error analysis. | |
|---|---|
| d | 5 μm |
| τ | 150 |
| $L_M$ | 6 μm |
| Temperature | 30° C. |
| Pressure | 1200 psia |
| $t_\Delta$ | 15 ⇔ 90 ms |

Figure 11:
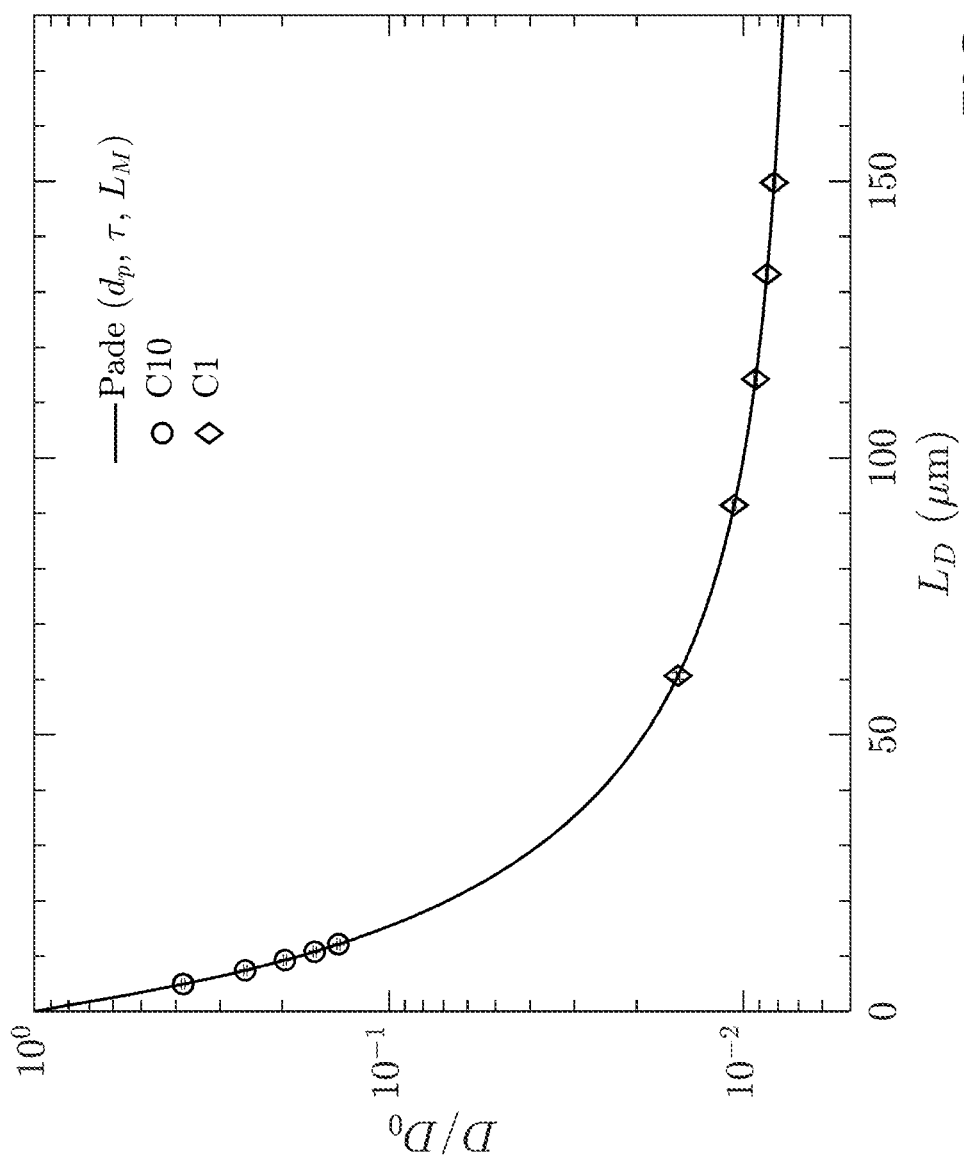
FIG. 11: simulated C1 and C10 data from the Padé equation. The solid curve is the Padé equation using Table 3 parameters. It shows data points of C1 and C10 mean value used in the Padé equation.

FIG. 11 shows the C10 and C1's restricted diffusivity calculated based on these chosen parameters and its bulk diffusivity. After calculating restricted diffusivity, 1% Gaussian noise is applied to both $L_D$ and the restricted diffusivity. The error in $L_D$ in the experiment mainly comes from the temperature fluctuation during the NMR measurement. The error in the measured normalized restricted diffusivity comes from both the temperature fluctuation and system error in the measurements and inversion algorithm. After getting the noise-added data, the Padé equation is used to extract the pore-body size and tortuosity information using non-linear curve-fitting (Isqcurvefit) in MATLAB.

Monte Carlo simulations were repeated with 1,000 realizations of the Gaussian noise. Based on 1% Gaussian noise, we calculate an average error ±4.3% for pore-body size and ±1.3% for tortuosity. This indicates that noise has a larger impact on the pore-body-size estimate than on the tortuosity estimate.

Figure 12:
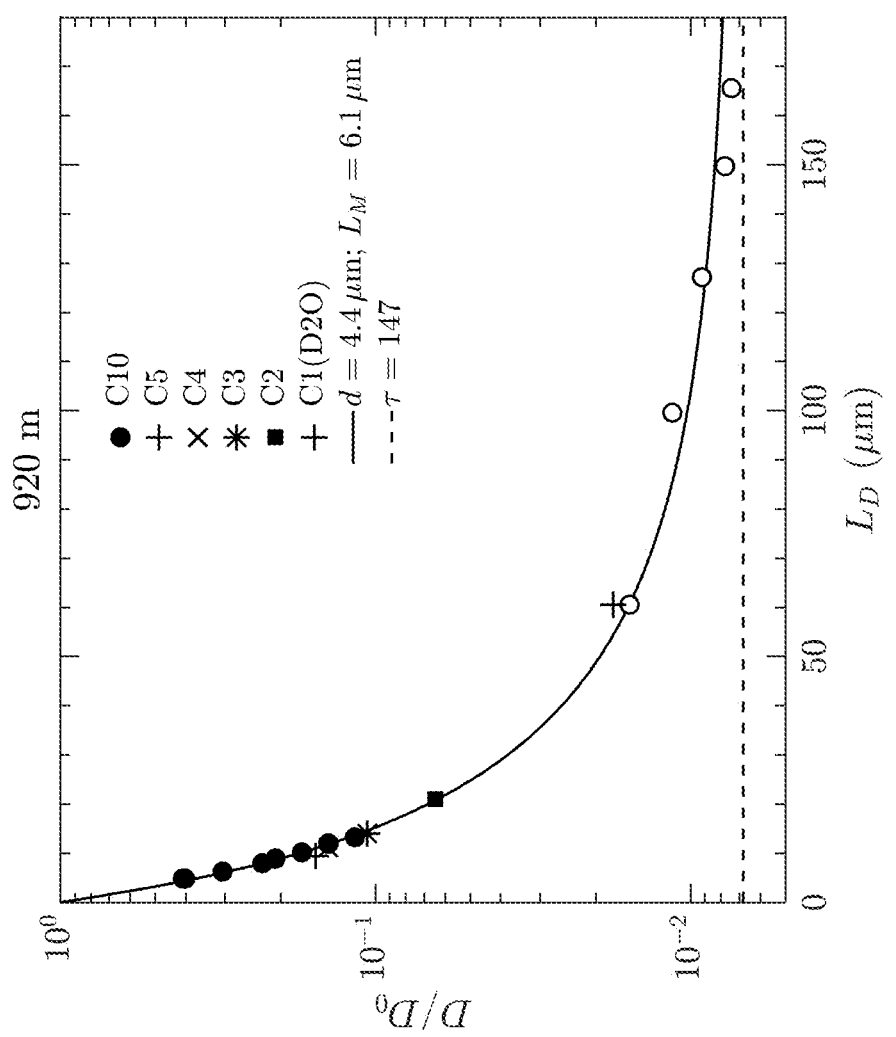
FIG. 12: Diffusion length ($L_D$) against normalized restricted diffusivity ($D/D_0$) for C10 and C1($D_2O$) are shown for 920 m, with additional data compared to FIG. 9

The other uncertainty is in selecting the hydrocarbons on the Padé fit. However as shown in FIG. 12 at 920 m, the best-fit parameters do not change significantly when adding C2, C3, C4, and C5 data at a single measured $L_D$. More specifically, $L_M$ and d change by ±10%, while τ is more robust and changes by only ±1%.

MICP, BTR, and Permeability

Figure 13:
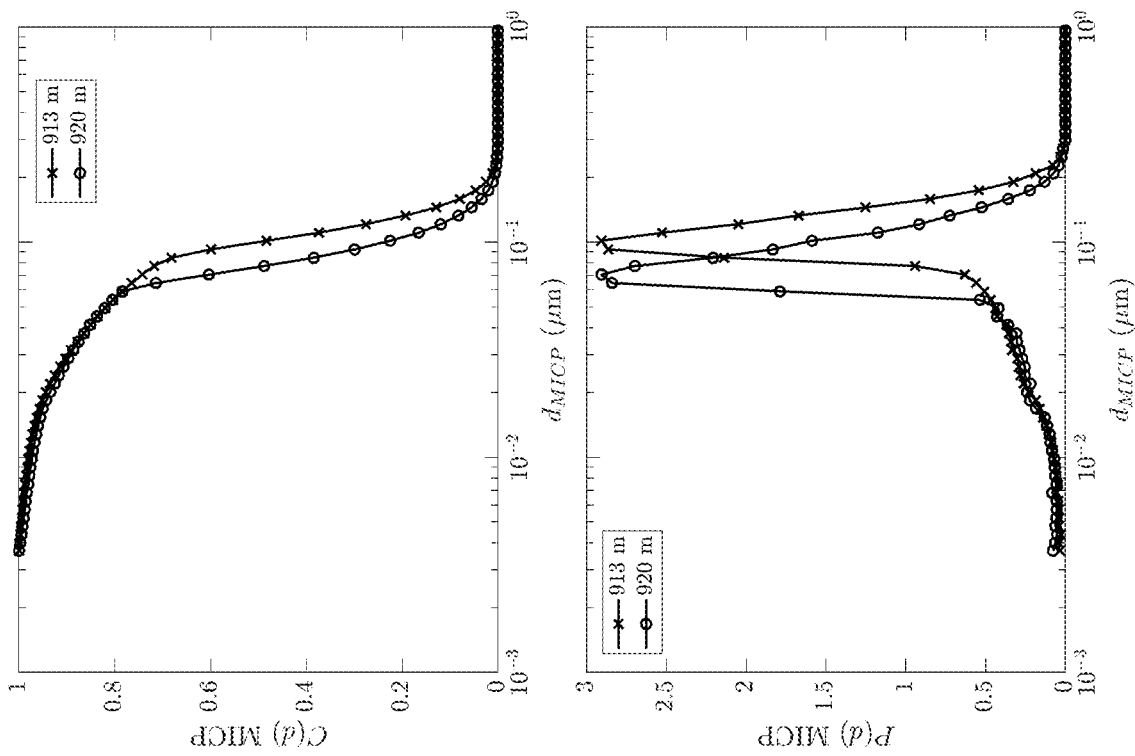
FIG. 13: Cumulative (top) and differential (bottom) distribution in pore-throat diameter from MICP at 913 m and 920 m.

The MICP cumulative saturation C(d) and differential P(d) pore-throat distribution from MICP at 913 m and 920 m are shown in FIG. 13. The total MICP porosity $\phi_{MICP}$≈24 pu agrees with the total NMR porosity $\phi_T \approx 25$ pu for both 913 m and 920 m. The largest $d_{MICP}$ value (i.e. at the entry pressure), defined at $C(d) \approx 0.1\%$, is $d_{MICP,entry}=0.27$ µm at both 913 m and 920 m, while the mode is $d_{MICP,mode}=0.1$ µm at 913 m and $d_{MICP,mode}=0.07$ µm at 920 m. Note that the micro-pore throat distributions are identical below $d_{MICP}$<0.05 µm for both 913 m and 920 m.

Figure 14:
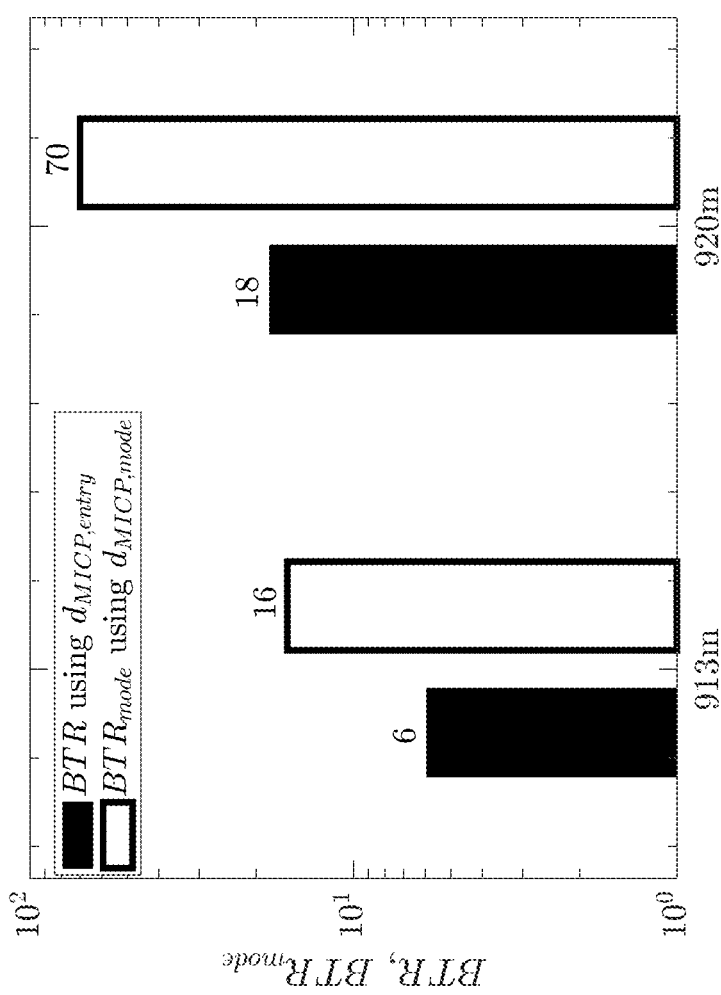
FIG. 14: BTR for 913 m and 920 m, using the entry and mode of the MICP pore-throat distributions. Table 4: Body-throat ratios for different rock types according to (Muller-Huber 2016) *, and the ATR Rock Catalog **.

The MICP pore-throat diameters can then be used to determine the body-throat ratio BTR as such:

$$BTR = \frac{d}{d_{MICP,entry}} \text{ or } BTR_{mode} = \frac{d}{d_{MICP,mode}}$$

where d is the pore-body diameter from the Padé fit of $D/D_0$ versus $L_D$. The results of the BTR are shown in FIG. 14. BTR using $d_{MICP,entry}$ are lower than $BTR_{mode}$ using $d_{MICP,mode}$. The BTR values are more consistent with expected values for chalks BTR≈20 listed in Table 4. The slightly lower BTR value at 913 m is possibly due to the lower d when using C4 (913 m) instead of C10 (920 m), or due to the lower d at 913 m.

TABLE 4

Body-throat ratios for different rock types according to (Muller-Huber 2016)*, andt he ATR Rock Catalog**.

| Rock type | BTR |
|---|---|
| Microcrystalline dolomite | 1-10 * |
| Vuggy dolomite | |
| Sucrosic dolomite | 10 to 20 * |
| Marly/micritoc limestone | |
| Micritic/dolomitic limestone | |
| Chalk | >20 * |
| Oomoldic limestone | |
| Oolitic limestone | |
| Sandstones | 3-5 ** |

In cases where MICP data is not available, previously reported values can be used instead, as listed in Table 4 by rock type.

With the region C porosity $\phi_M$, pore-body size d and tortuosity τ all determined from $D/D_0$ versus $L_D$, plus the body-throat ratio BTR from $d_{MICP,entry}$, the Carman-Kozeny equation predicts the following the permeabilities k:

$$k = \frac{\phi_M}{32\tau} \frac{d^2}{BTR^2} = \frac{0.15}{32 \times 54} \times \frac{1.6^2}{6^2} = 0.006 \text{ mD (913 m)}$$

$$k = \frac{\phi_M}{32\tau} \frac{d^2}{BTR^2} = \frac{0.13}{32 \times 149} \times \frac{4.9^2}{18^2} = 0.002 \text{ mD (920 m)}$$

These estimates are found to be a factor≈⅛ smaller compared to measurements where $k_{meas}=0.035$ mD at 913 m, and $k_{meas}=0.017$ mD at 920 m. A pre-factor A can be used to match the predictions from measurements, leading to the final expression:

$$k = A\frac{\phi_M}{32\tau} \frac{d^2}{BTR^2} \text{ where } A \approx 8$$

which is used in the methods below to predict permeability on logs and core X.

A small correction in the above formulation which takes the contact angle of mercury on a rough surface into account. On a smooth surface, which is assumed above, the mercury-air contact angle is θ=145°, and the following conversion is used to determine $d_{MICP}$ from capillary pressure $P_c$:

$$P_c = \frac{4\gamma \cos\theta}{d_{MICP}}$$

where γ is the mercury-air surface tension. However, for a rough surface has θ=180° (Muller-Huber 2016), resulting in smaller BTR values by a factor 0.81, and therefore A≈5 which is closer to unity as predicted by Carman-Kozeny.

Another variation is to use the total porosity $\phi_T$ instead of the region C porosity $\phi_M$, which would further reduce the pre-factor to A≈2.5.

Validation of Permeability

Figure 15:
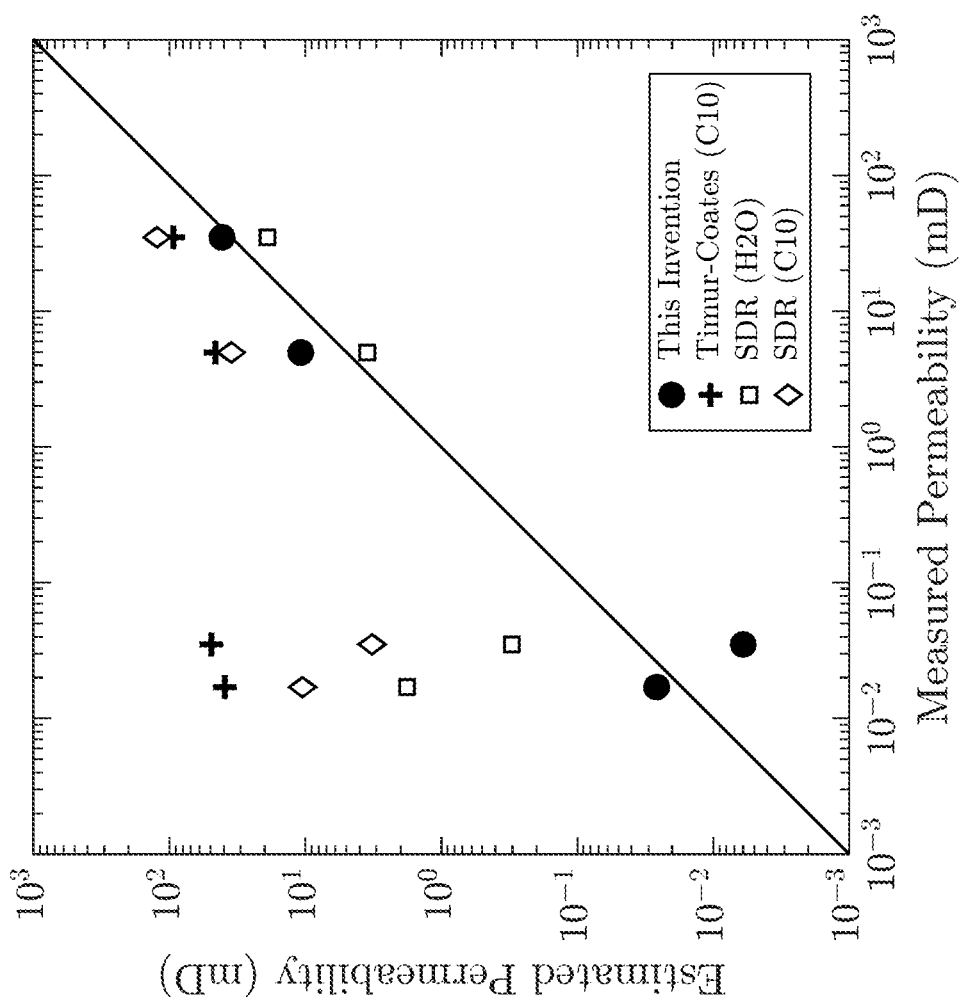
FIG. 15: Permeability estimates for two organic rich chalks from 913 m and 920 m depths and two Austin chalk samples compared to permeability measurements.

The validation of the invention using the Carman-Kozeny permeability transform is shown in FIG. 15, for the organic rich chalks from 913 m and 920 m, and for two Austin chalk samples.

For the modified Carman-Kozeny model, a BTR of 5 is assumed for both 913 m and 920 m. The BTR of 5 originates from the Austin chalk sample where MICP pore-throat size ($d_{throat}$) using the Swanson method (Swanson, 1981) and pore-body size (d) yield BTR=d/$d_{throat}$=5. We do not use $d_{throat}$ from MICP for 913 and 920 m cores since kerogen/bitumen is highly deformable, which makes the MICP data unreliable, and as shown above elicits an arbitrary pre-factor A. The following estimates are obtained:

$$k = \frac{\phi_M}{32\tau} \frac{d^2}{BTR^2} = \frac{0.15}{32 \times 54} \times \frac{1.6^2}{5^2} = 0.006 \text{ mD (913 m)}$$

$$k = \frac{\phi_M}{32\tau} \frac{d^2}{BTR^2} = \frac{0.13}{32 \times 149} \times \frac{4.9^2}{5^2} = 0.026 \text{ mD (920 m)}$$

$$k = \frac{\phi_M}{32\tau} \frac{d^2}{BTR^2} = \frac{0.25}{32 \times 7} \times \frac{30.6^2}{5^2} = 41 \text{ mD (Austin Chalk)}$$

$$k = \frac{\phi_M}{32\tau} \frac{d^2}{BTR^2} = \frac{0.15}{32 \times 9} \times \frac{23.3^2}{s^2} = 10.8 \text{ mD (Austin Chalk 2)}$$

For the Timur-Coates model, the $T_2$ cutoff for C10 region C is used to separate the BFV and FFV. Two different versions of the SDR model are used; one uses the $T_2$ logarithmic mean of the SW1 core, and the other uses the $T_2$ logarithmic mean of C10 region C.

For the sample of Austin chalk, the estimated permeabilities are all near the measured permeabilities. For the low-permeability organic-rich chalk cores from 913 m and 920 m, Timur-Coates and SDR have a large offset compared with measured permeability. The new permeability estimation method uses the modified Carman-Kozeny model with the diffusive tortuosity and pore-body size from NMR restricted diffusion on hydrocarbon-saturated cores with connate water present. This new method estimates the NMR permeability to hydrocarbons at connate water ($k_o(S_{wc})$).

The new method delivers good permeability estimation without empirical parameters, for both the low-permeability organic-rich chalks with their complex pore system and the conventional Austin chalk and Indiana limestone. This new method may also be applied in downhole gradient-based NMR logging for the permeability estimation with the diffusive tortuosity directly measured downhole or from the laboratory.

Core Permeability Using NMR Diffusion-$T_2$ Measurements

The method requires measuring NMR diffusion-$T_2$ (D-$T_2$) and permeability on a selection of cores of different lithologies (i.e. rock types), then using the calibrated parameters (including body-throat-ratio BTR and cementation exponent m) to determine permeability of core X in a large case study, without having to measure a (more time consuming) light hydrocarbon (e.g. C1) for each core X.

Method:
1. Obtain cores from a selection of depths to cover all lithologies (i.e. rock types).
2. Measure D-$T_2$ on cores to determine movable fluid porosity ($\phi_M$), i.e. porosity above $T_2 > T_{2cutoff}$, and restricted diffusion ($D/D_0$), where $D_0$ is bulk diffusion versus diffusion length $$(L_D = \sqrt{D_0 t_\Delta},$$

where $t_\Delta$ is the diffusion encoding time) using a light hydrocarbon (e.g. C1) and a heavier hydrocarbon (e.g. C4 or C10) to cover a range of $L_D$.
3. Fit $D/D_0$ versus $L_D$ using Padé fit to determine pore body size (d), heterogeneity length scale ($L_M$), and tortuosity ($\tau$) for each core.
4. Determine the cementation exponent (m) for each lithology using $\tau = \phi_M^{1-m}$.
5. Determine heterogeneity length scale ($L_M$) for each lithology.
6. Measure core permeability (k) and determine the body-throat ratio BTR for each lithology from the Carman-Kozeny equation $$k = \frac{\phi_M d^2}{32 \tau BTR^2}$$

7. Measure D-$T_2$ on core X to determine movable fluid porosity ($\phi_{M,X}$), i.e. porosity above $T_2 > T_{2cutoff}$, and $D_X/D_0$ versus $T_2$ using a heavier hydrocarbon (e.g. C4 or C10) to cover a short $L_D$.
8. Determine tortuosity log ($\tau_X$) using $$\tau_X = \phi_{M,X}^{1-m},$$

where m is known for each lithology from step 4.
9. Fit $D_X/D_0$ versus $T_2$ using Padé fit to determine pore-body size ($d_X$), with $\tau_X$ known from step 8, and $L_M$ fixed for each lithology from step 5.

10. Determine permeability ($k_X$) for core X from $$k_X = \frac{\phi_{M,X} d_X^2}{32 \tau_X BTR^2},$$

with BTR known for each lithology from step 6.

Variations:
1. Use total porosity ($\phi_T$) instead of movable fluid porosity ($\phi_M$).
2. Use an amplitude factor (A) in the Carman-Kozeny relation $$k = A \frac{\phi_M d^2}{32 \tau BTR^2}$$

3. Fix tortuosity ($\tau$) instead of cementation exponent (m) for each lithology.
4. Do not use heterogeneity length-scale ($L_M$) in Padé fit, i.e. assume $L_D/L_M = 0$.
5. Use another fitting function for $D/D_0$ versus $L_D$ besides the Padé fit.
6. Use another permeability prediction besides Carman-Kozeny relation.
7. Fix BTR based on known values for each lithology.
8. Determine BTR=$d/d_{throat}$ from MICP $d_{throat}$ for each lithology.
9. Use different fluids with a large $D_0$ (i.e., not C1) and small $D_0$ (i.e., not C4 and not C10).
10. Make no distinction in lithology.
11. Deuterate the connate water with heavy-water or dope it with paramagnetics to remove the water signal.
12. Measure the core at 100% hydrocarbon saturation without connate water.

Downhole Permeability Log Using NMR Diffusion-$T_2$ Measurements

The method requires measuring NMR diffusion-$T_2$ (D-$T_2$) and permeability on a selection of cores of different rock types, then using the core calibrated parameters (including body-throat-ratio BTR and cementation exponent m) to interpret D-$T_2$ logs to obtain a permeability log.

More specifically, the permeability is measured in the laboratory and used with the permeability equation to determine a value of BTR for that lithology. That BTR and m for each lithology are then used in the downhole wireline NMR diffusion logging with a gradient-based NMR logging tool to generate a continuous downhole permeability log. Examples of gradient-based downhole NMR logging tool include Baker-Hughes MREX, Schlumberger's MR Scanner and Halliburton's MRIL.

Method:
1. Obtain cores from a selection of depths to cover all lithologies (i.e. rock types).
2. Measure D-$T_2$ on cores to determine movable fluid porosity ($\phi_M$), i.e. porosity above $T_2 > T_{2cutoff}$, and restricted diffusion ($D/D_0$), where $D_0$ is bulk diffusion versus diffusion length $$(L_D = \sqrt{D_0 t_\Delta},$$

where $t_\Delta$ is the diffusion encoding time) using a light hydrocarbon (e.g. C1) and a heavier hydrocarbon (e.g. C4 or C10) to cover a range of $L_D$.

3. Fit $D/D_0$ versus $L_D$ using Padé fit to determine pore body size (d), heterogeneity length scale ($L_M$), and tortuosity ($\tau$) for each core.
4. Determine the cementation exponent (m) for each lithology using $\tau = \phi_M^{1-m}$.
5. Determine heterogeneity length scale ($L_M$) for each lithology.
6. Measure core permeability (k) and determine the body-throat ratio BTR for each lithology from the Carman-Kozeny equation $$k = \frac{\phi_M d^2}{32\tau BTR^2}$$

7. Measure $D$-$T_2$ log to determine movable fluid porosity ($\phi_{M,\ log}$), i.e. porosity above $T_2 > T_{2cutoff}$, and $D_{log}/D_0$ versus $T_2$.
8. Determine tortuosity log ($\tau_{log}$) using $$\tau_{log} = \phi_{M,log}^{1-m},$$

where m is known for each lithology from step 4.
9. Fit $D_{log}/D_0$ versus $T_2$ using Padé fit to determine pore-body size ($d_{log}$), with $\tau_{log}$ known from step 8, and $L_M$ fixed for each lithology from step 5.
10. Determine downhole permeability ($k_{log}$) from $$k_{log} = \frac{\phi_{M,log} d_{log}^2}{32\theta_{log} BTR^2},$$

with BTR known for each lithology from step 6.
Variations:
1. Use total porosity ($\phi_T$) instead of movable fluid porosity ($\phi_M$).
2. Use an amplitude factor (A) in the Carman-Kozeny relation $$k = A\frac{\phi_M d^2}{32\tau BTR^2}$$

3. Fix tortuosity ($\tau$) instead of cementation exponent (m) for each lithology.
4. Do not use heterogeneity length-scale ($L_M$) in Padé fit, i.e. assume $L_D/L_M=0$.
5. Use another fitting function for $D/D_0$ versus $L_D$ besides the Padé fit.
6. Use another permeability prediction besides Carman-Kozeny relation.
7. Fix BTR based on known values for each lithology.
8. Determine BTR=$d/d_{throat}$ from MICP $d_{throat}$ for each lithology.
9. Use different fluids with a large $D_0$ (i.e., not C1) and small $D_0$ (i.e., not C4 and not C10).
10. Make no distinction in lithology.
11. Deuterate the connate water with heavy-water or dope it with paramagnetics to remove the water signal.
12. Measure the core at 100% hydrocarbon saturation without connate water.

New Permeability Equation Extending BTR

Figure 16:
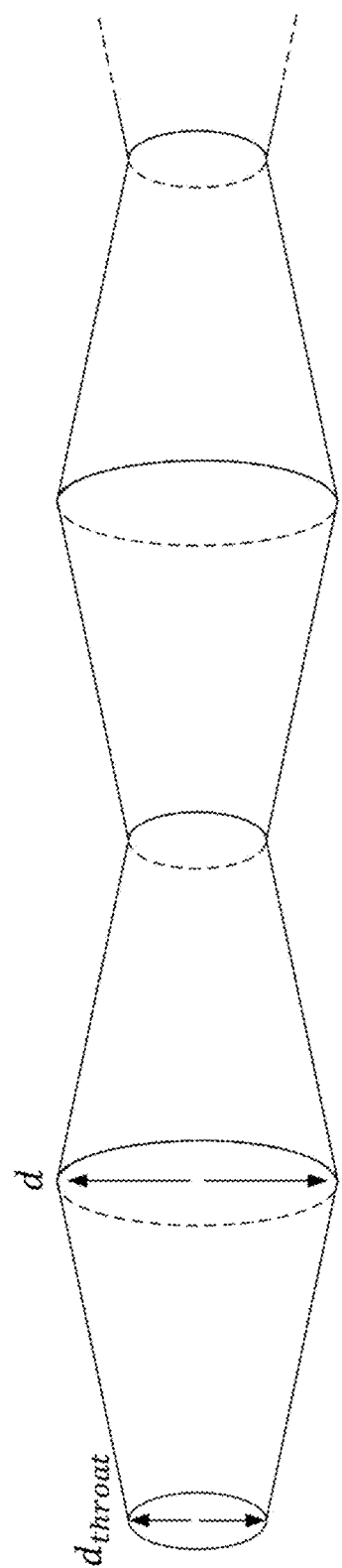
FIG. 16: Illustration of flow paths comprised of a sequence of cone frustrums of pore-body size d and pore-throat size $d_{throat}$=d/BTR.

New permeability equations may be based on empirical findings of the data, or by modifying the Carman-Kozeny (or other) equation based on physical models. One such modification based on physical models incorporates work by Monicard 1980, see FIG. 16, where instead of parallel cylinders, the flow paths are comprised of a sequence of cone frustrums of pore-body size d and pore-throat size $d_{throat}$=d/BTR. The BTR value characterizes the ratio of the widest to narrowest sections of the cones.

The modified Carman-Kozeny equation is then:

$$k = A\frac{\phi_M}{32\tau}\frac{d^2}{BTR^2}M \text{ where } M = \frac{9BTR^3}{(BTR^2 + BTR + 1)^2}$$

Figure 17:
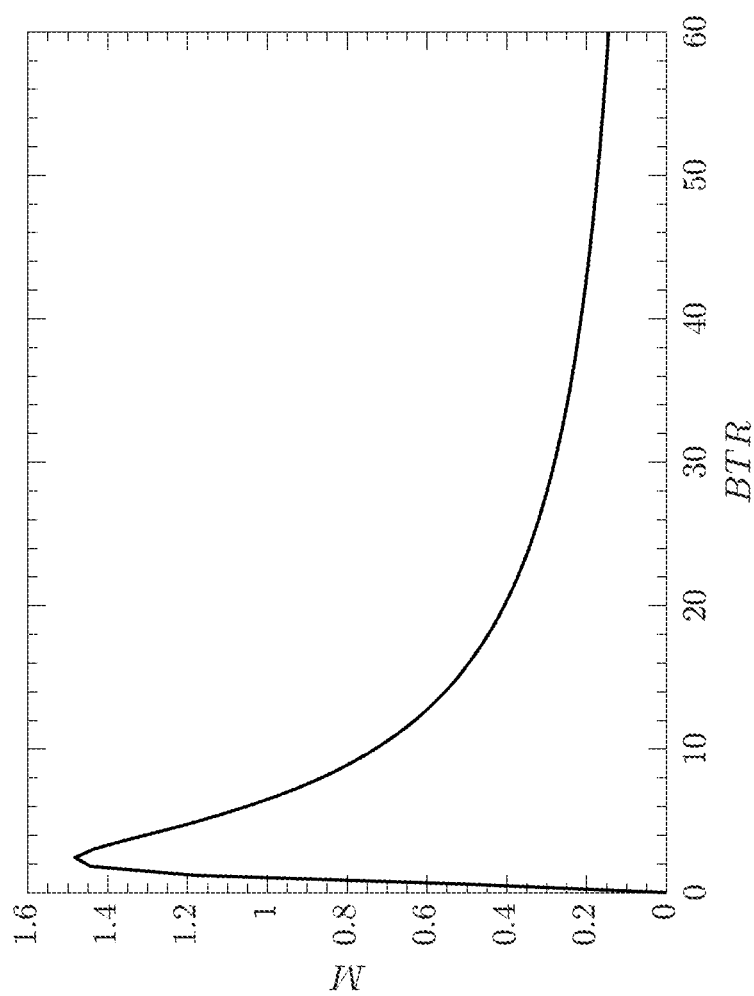
FIG. 17: The value of M as a function of BTR for the permeability equation.

The extra term M is equal to unity M=1 at BTR=1, tends towards M≈9 BTR for BTR<<1, and tends towards M≈9/BTR for BTR>>1, as shown in FIG. 17.

This equation provides a new method for determining BTR in the laboratory. The permeability k of the core is measured by routine core analysis (either steady-state or unsteady-state methods), $\phi_M$, $\tau$, and d are measured by NMR diffusion, set A=1, and this equation is then solved for the BTR of the mobile hydrocarbons. This new method of determining BTR is non-destructive (no Hg injection) and more accurately determines the BTR of the portion of the pore size distribution where the mobile hydrocarbons reside. The BTR determined using this method can be applied to the downhole wireline NMR log for determining a continuous permeability log of the mobile hydrocarbons.

Variations on the Methodology

Saturation State of the Core

The first option for core saturation is to measure the core at irreducible water saturation $S_{wirr}$, which is the case shown in FIG. 5 and all subsequent figures. In this case, the connate water is present in Region B, and the tortuosity of the hydrocarbon phase is measured in Region C. In conventional reservoirs, having the core at $S_{wirr}$ resembles reservoir conditions at heights well above the free water level. In other words, having the core at $S_{wirr}$ resembles downhole conditions in the oil-bearing zone, and therefore allows for better comparison with permeability from log data.

Another reason for having the core at $S_{wirr}$ is that in the case of chalks, the micritic porosity has a large tortuosity which does not contribute to permeability. As such, the tortuosity from the micritic porosity should not be counted when deriving a permeability transform which uses tortuosity as an input. The best way to avoid this is to have the core at $S_{wirr}$ and to measure tortuosity of the movable hydrocarbon (which is immiscible with water), as illustrated in FIG. 4. In such cases, the tortuosity of the hydrocarbon phase in Region C will correspond to the tortuosity used in a permeability transform. Note that measuring tortuosity of the hydrocarbon phase at $S_{wirr}$ is possible with NMR, but it is not possible with electrical resistivity.

The second option for core saturation is to measure the core 100% saturated with a single fluid, e.g. 100% brine saturated or 100% hydrocarbon saturated. This option is appropriate when there is no micritic porosity, as in the case for sandstones, limestones, and dolomites. In such cases, the tortuosity of the 100% saturating phase corresponds to the tortuosity in a permeability transform, therefore the core does not need to be at $S_{wirr}$.

Figure 18:
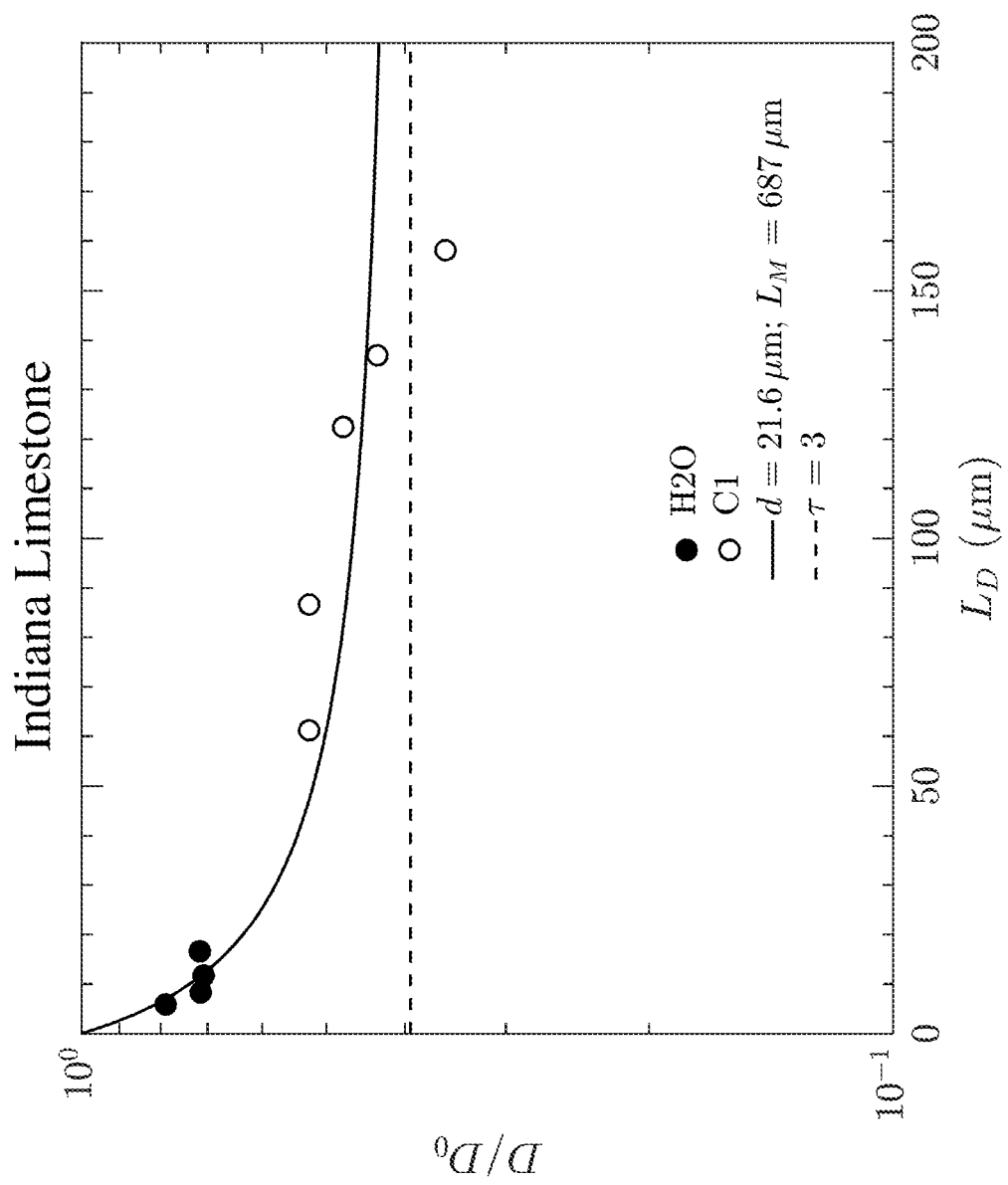
FIG. 18: Diffusion length ($L_D$) against normalized restricted diffusivity ($D/D_0$) for 100% $H_2O$ and 100% C1 saturated Indiana limestone.

FIG. 18 below shows the results of 100% H2O saturated data, and 100% C1 saturated data after drying, on an Indiana limestone core.

Using the above Padé fit, the following calculation is made:

$$k = \frac{\phi_M}{32\tau}\frac{d^2}{BTR^2} = \frac{0.17}{32 \times 3} \times \frac{21.6^2}{5^2} = 32 \text{ mD (Indiana limestone)}$$

which shows excellent agreement with the range of measured values for this block of Indiana limestone ranging between 30-50 mD.

Determining the Diffusion Coefficient

Figure 19:
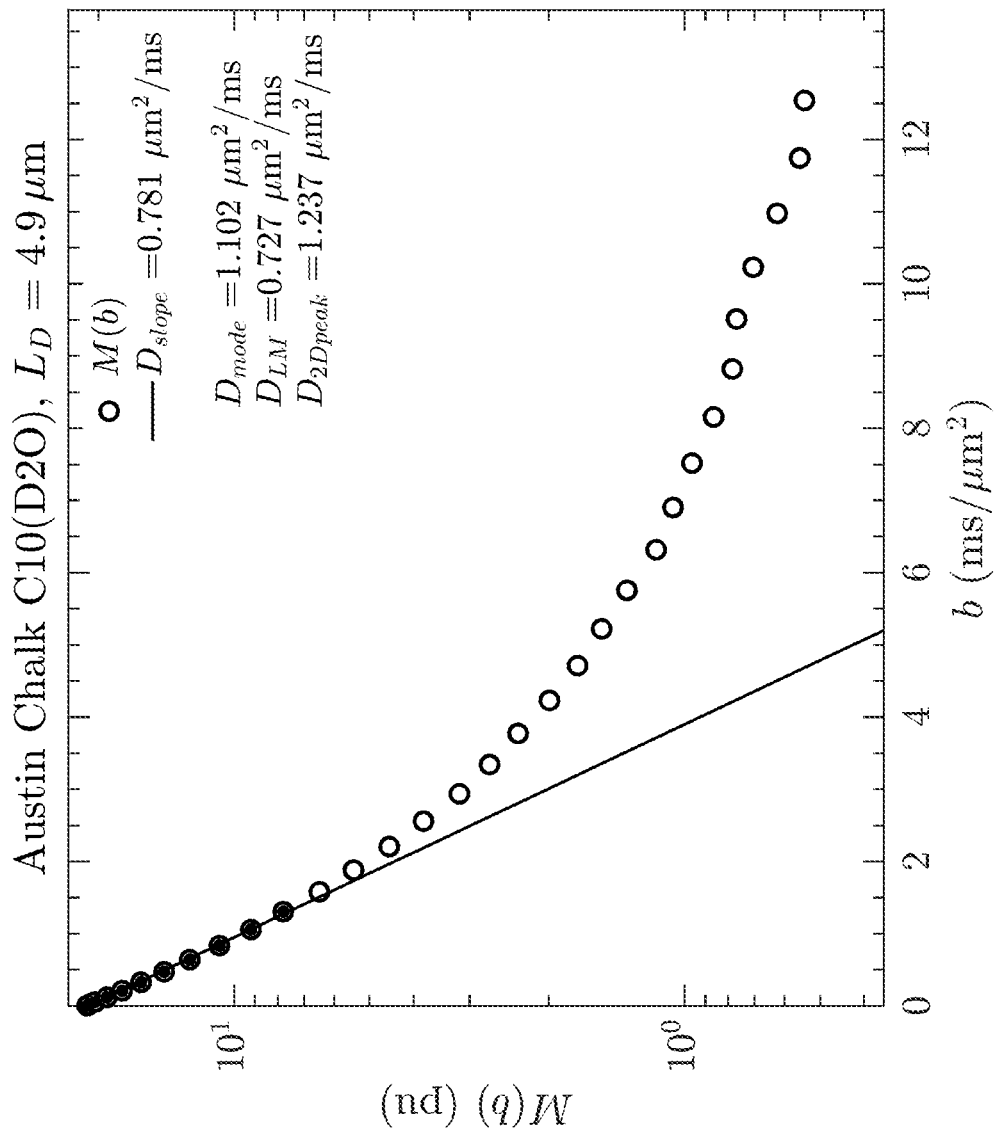
FIG. 19: Example of decay in magnetization M(b) due to diffusion encoding parameter $$b = q^2(t_\Delta - t_\delta/3 + \varepsilon)$$

The diffusion coefficient D used to plot restriction $D/D_0$ versus $L_D$ in FIG. 12 was determined by the 2D peak (i.e. mode) of the D-$T_2$ map, hereby called $D_{2Dpeak}$. Another way to determine D is to fit the initial slope of the magnetization decay due to diffusion encoding, as shown in the example in FIG. 19 for an Austin Chalk sample at $S_{wirr}$ with C10 and $D_2O$ connate brine. In this example, the diffusion coefficient from the initial slope $D_{slope}=0.781$ μm$^2$/ms is ~40% lower than $D_{2Dpeak}=1.237$ μm$^2$/ms at the 2D peak of the D-$T_2$ map.

Yet another way to determine the diffusion coefficient is at the peak of the 1D diffusion distribution $D_{1Dpeak}=1.102$ μm$^2$/ms, or the log-mean value of the 1D diffusion $D_L m=0.727$ μm$^2$/ms. The log-mean method is comparable to the slope method, while the 1D and 2D peak methods yield ~30-40% larger diffusion coefficients.

One big caveat with the slope, 1D peak and log-mean methods for cores at $S_{wirr}$ is that the cores must have deuterated ($D_2O$) connate brine, otherwise these techniques will yield an average diffusion coefficient from the $H_2O$ connate brine and the hydrocarbon phase, which is incorrect. The 2D peak technique does not suffer from this issue since a $T_2$ cutoff is applied to separate hydrocarbons from water before determining $D_{2Dpeak}$.

An example of the effects of $D_{slope}$ versus $D_{2Dpeak}$ to the Padé fit is shown in FIG. 20. The Padé fit using $D_{2Dpeak}$ indicates a reasonable tortuosity of τ=7 but a large pore-size of d=30.6 μm. On the other hand, using $D_{slope}$ indicates a reasonable pore-size of d=7.5 μm but a large tortuosity of τ=20. Further investigations are required to determine which measure of D is more accurate, however note that the Carman-Kozeny permeability transform is more susceptible to inaccuracies in pore-size ($k \propto d^2$) than to tortuosity ($k \propto 1/\tau$).

Another caveat with the slope technique is that $D_{slope}$ represents the average diffusion coefficient over all pore sizes, without the option of selecting pore types based on $T_2$. This presents an issue in cores which contain a significant amount of vugs, an example of which is shown in FIG. 21 for an Indiana limestone core saturated with brine. The large peak at long $T_2>750$ ms originates from vugs with almost no surface relaxation and no restricted diffusion. Furthermore, vugs do not contribute to the NMR permeability transform, therefore only signal below $T_2<750$ ms should be considered (Chang et al, 1994, Hidajat et al. 2004).

Using the $D_{slope}$ in such cases results in an artificially low tortuosity since the vugs dominate the signal. This accounts for the lower tortuosity from $D_{slope}$ compared to electrical tortuosity in Indiana Limestone, as was previously reported (Yang et al., 2019). The solution is to use $D_{2Dpeak}$ in the region $T_2<750$ ms instead. Note that $D_{1Dpeak}$ and $D_{LM}$ would also fail in such cases.

Determining the Tortuosity

Another method for determining tortuosity is not to use the Padé model (or any other model), but to simply determine the tortuosity from the average of the C1(D2O) data at large $L_D$. An example of this technique is shown in FIG., where it is clear that the average tortuosity is smaller than the Padé fit results from FIG. 20. In the case of $D_{2Dpeak}$ the average tortuosity is ~30% smaller compared to the Padé tortuosity, while in the case of $D_{slope}$ the average tortuosity is ~60% smaller compared to the Padé tortuosity. Note that the y-axis in FIG. 22 is on a linear scale instead of a log scale.

The advantage of the average tortuosity is that no model (such as the Padé model) is required to fit the data. The disadvantage of the average tortuosity method is that the pore-size cannot be determined since there is no information used at short $L_D$. A potential work around is to use a separate fit to the initial slope of $D/D_0$ versus $L_D$ to get the average pore-size, however as shown in FIG. 22, the decay at the shortest $L_D$ is already too large to fit a linear decay, thereby yielding an inaccurate pore-size.

Improving Accuracy at Short Diffusion Lengths

Another variation of the above methodology is to obtain more accuracy at short $L_D$ by reducing $D_0$ of the bulk alkane, thereby improving the accuracy of the pore-size estimation. This can be accomplished by increasing the carbon number above C10 and/or reducing the temperature, thereby reducing $D_0$ and $L_D$.

TABLE 5

List of viscosities (Rossini et al. 1953), bulk diffusion coefficients (Tofts et al. 2000), and diffusion lengths (at the shortest encoding time) of various n-alkanes, and water.

| Molecule | T (C) | P (bar) | η (cP) | $D_0$ (μm$^2$/ms) | $t_\Delta$ (ms) | $L_D$ (μm) |
|---|---|---|---|---|---|---|
| H2O | 23 | 1 | 1.00 | 2.15 | 15 | 5.68 |
| H2O | 4 | 1 | 1.52 | 1.28 | 15 | 4.38 |
| C4 | 23 | 2.2 | 0.18 | 7.54 | 15 | 10.64 |
| C5 | 20 | 1 | 0.24 | 4.34 | 15 | 8.07 |
| C6 | 23 | 1 | 0.31 | 3.70 | 15 | 7.45 |
| C7 | 23 | 1 | 0.42 | 2.99 | 15 | 6.70 |
| C8 | 20 | 1 | 0.55 | 2.14 | 15 | 5.67 |
| C9 | 20 | 1 | 0.72 | 1.63 | 15 | 4.94 |
| C10 | 20 | 1 | 0.93 | 1.26 | 15 | 4.35 |
| C10 (*) | -10 | 1 | 1.39 | 0.76 | 15 | 3.37 |
| C11 | 20 | 1 | 1.19 | 1.01 | 15 | 3.89 |
| C12 | 20 | 1 | 1.51 | 0.78 | 15 | 3.42 |
| C13 | 20 | 1 | 1.89 | 0.63 | 15 | 3.07 |
| C14 | 20 | 1 | 2.34 | 0.49 | 15 | 2.71 |
| C15 | 20 | 1 | 2.87 | 0.40 | 15 | 2.45 |
| C16 | 20 | 1 | 3.48 | 0.34 | 15 | 2.26 |

(*) viscosity extrapolated from Lee et al. 1965, assuming $D_0 \propto T/\eta$.

As listed in Table 5, increasing the carbon number from C10 to C16 reduces $D_0$ by a factor~4, and therefore reduces $L_D$ by a factor~2 from $L_D \approx 4$ μm to $L_D \approx 2$ μm. This will significantly improve the pore-size estimation for pares less than d<5 μm.

Another way to reduce $D_0$ and $L_D$ is to lower the temperature of the measurement. As listed in Table 5, if water is used as the saturating fluid, $D_0$ decreases by ~50% and $L_D$ decreases by ~25% when going from ambient temperature to 4° C. If decane is used as the saturating fluid, $D_0$ decreases by ~40% and $L_D$ decreases by ~20% when going from ambient temperature to −10° C.

An extension of this technique is to reduce the temperature below T<0° C. such that the water signal disappears, i.e. $T_2<t_E$ for ice, and one is left with only the hydrocarbon NMR signal. This will replace the need for $D_2O$ exchange with water in the above methodology, and it will reduce $L_D$ of the hydrocarbon for better determination of pore-size. One caveat is that the water may freeze below T<0° C. in nano-pores due to the Gibbs-Thomson effect, in which case lower temperatures are required; this phenomenon can (in principle) also be used to determine the nano-pore size distribution in porous media, a.k.a. NMR cryoporometry (Weber 2010).

Fluids with Large Diffusivity

A fluid with large diffusivity $D_0$ (i.e. large diffusion length $L_D$) is required for determining the tortuosity in the Padé fit. For the fluid candidate which has large bulk diffusivity, $CH_4$ is a good candidate, when using $^1$H-NMR. Even though $H_2$ and HD have larger bulk diffusivities than methane, they have lower HI. FIG. 23 shows the hydrogen index (HI) comparison between water, methane, $H_2$, and HD. We obtain the molar density of the fluids from the REFPROP database. The temperature for the fluid properties is fixed at 30° C. The pressure ranges from 1 psia to 2,000 psia. HD's HI is too low. $H_2$'s HI is relatively higher than HD. And for bulk $H_2$, $T_2$~15 ms at 147 psi and room temperature. For the high-pressures, the $T_2$ should be higher than 15 ms, because $T_2$ is linearly dependent on the density (Abragam, 1961).

Workflow to Optimize Pulse Parameters

The workflow shown below consists of a quick measurement with default pulse parameters, followed by a full measurement with optimized parameters:

1. Measure a quick D-$T_2$ using the default pulse parameters, which comprises a minimum number of scans (NS), a small number of gradient steps (NG), and the minimum diffusion time ($t_\Delta$). The gradient list in the range G=0→$G_{max}$ is set based on NG linearly-spaced steps, where $G_{max}$ is the maximum gradient strength.
2. Optimize $G_{max}$ based on diffusion decay M(b) by either (1) increasing $G_{max}$ if more decay is required in M(b) due to slowly decaying components, (2) decreasing $G_{max}$ if there is insufficient data at short b due to fast decaying components. An algorithm can be used to forward model M(b) based on D-$T_2$ from the default parameters, from which $G_{max}$ can be optimized.
3. Measure a full D-$T_2$ using a larger number of scans (NS) for higher SNR, and a gradient list in the range G=0→$G_{max}$ using the optimized $G_{max}$, with a larger number of linearly-spaced gradient steps (NG) to obtain more data at short b.
4. Measure full D-$T_2$ at larger diffusion-times ($t_\Delta$) in order to probe larger diffusion-lengths ($L_D$). For each $t_\Delta$, $G_{max}$ is now optimized by keeping $$b_{max} = q_{max}^2(t_\Delta - t_\delta/3 + \varepsilon)$$

roughly constant, where $$q_{max} = \gamma t_\delta G_{max}.$$

In other words, the product $t_\Delta G_{max}^2$ is kept roughly constant for each $t_\Delta$ measurement.

An example of the diffusion decay M(b) using the default parameters is shown in FIG. 24, as well as the default parameters used. The parameters are defined in FIG. 1. NG is defined as the number of gradient steps, and NS is the number of scans which according to Table 1 has to be a multiple of 16 due to phase cycling. The gradient list in the range G=0→$G_{max}$ is set based on NG linearly-spaced steps, where $G_{max}$ is the maximum gradient strength. The minimum NS=16 is used in order to save time. The minimum $t_\Delta$ is used in order to capture the most signal (i.e. the shortest dead time for encoding diffusion).

The above core example has both irreducible water represented by the long tail in the M(b) decay with small D, and methane signal represented by the fast-decaying portion in M(b) with large D. Note that the linear spacing in the gradient list G means that there are more points clustered at small b compared to large b since b∝$G^2$. This is intentional since typically more resolution is required at small b.

The quick test in FIG. 24 shows insufficient decay in M(b); from ~2.7 pu to ~0.7 pu (i.e. only a factor~4 decay), which will limit the resolution in the slow decaying component. As such, $G_{max}$ is increased from 12 G/cm to 20 G/cm in order to increase the measured decay in M(b). The optimized data are shown in FIG. 25, which now decays from ~2.7 pu to ~0.4 pu, i.e. by a factor~7 decay. Increasing $G_{max}$ further (i.e. to the instrument maximum of 45 G/cm) is not optimal since a sufficient number of points in the gradient list are required at short b to capture the initial fast-decaying component in M(b). For instance, the initial decay in FIG. 25 is captured by the first ~16 data points alone. An algorithm can be used to forward model M(b) based on D-$T_2$ from the default parameters, from which $G_{max}$ can be optimized.

The difference between the default and optimal parameters on the diffusion projection is shown in FIG. 26. The insufficient decay in M(b) using the default parameters results in a long tail in P(D) at small D (i.e. the irreducible water), which is remedied when using the optimal parameters. Note also how the peak in P(D) at large D (i.e. the methane) is slightly sharper for the optimized parameters, which is a result of having higher SNR and more data points in the initial decay of M(b), that is ~16 data points versus ~9.

The difference between the default and optimal parameters on the on D-$T_2$ maps is shown in FIG. 27, from which the same conclusions can be reached as from the diffusion projection in FIG. 26.

Downhole NMR Logging Applications

The modified Carman-Kozeny permeability estimation method using hydrocarbon diffusive tortuosity from D-$T_2$ measurements can be applied to downhole NMR logging applications. There are several practical considerations listed below:

1. This invention needs fluids with different bulk diffusivity to cover a wide range of the diffusion length ($L_D$). In the downhole NMR logging application, if there are gas and liquid, we can distinguish them using a D-$T_2$ map and estimate their restricted diffusivity (Minh et al. 2015, Vinegar et al. 2020).
2. This invention has been demonstrated on (organic-rich) chalk and other carbonate formations such as limestones and dolomites. For maximum accuracy, the BTRs should be determined in the laboratory for different formations using this invention and those BTRs should be used in the downhole NMR logging.

This invention may require relatively high signal-to-noise ratio (SNR) in D-$T_2$ measurements. Indeed, in some cases the downhole NMR gradient-based logging tools may not get such high-quality data as obtained in the laboratory (Minh et al. 2015, Vinegar et al. 2020). In the NMR downhole measurements, taking an average of adjacent depths may be necessary to increase SNR. Holding the logging tool stationary to obtain a large number of averages is another way to increase SNR.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons skilled in the art.

REFERENCES

ATR Rock Catalog

Archie, G. E., 2003: The Electrical Resistivity Log as an Aid in Determining Some Reservoir Characteristics. *SPE Reprint Series*, 146, 9-16.

Bernabé, Y.; Mok, U.; Evans, B., 2006: A Note on the Oscillating Flow Permeability. *International Journal of Rock Mechanics and Mining Sciences*, 43, 311-316.

Carey, G. R.; McBean, E. A.; Feenstra, S., 2016: Estimating Tortuosity Coefficients Based on Hydraulic Conductivity. *Groundwater*, 54, 476-487.

Carman, P. C., 1997: Fluid Flow Through Granular Beds, *Process Safety and Environmental Protection: Transactions of the Institution of Chemical Engineers, Part B.*, 75, S32-S48.

Chang, D., Vinegar, H. J., Morriss, C., Straley, C., 1994: Effective Porosity, Producible Fluid and Permeability in Carbonates from NMR Logging, *Society of Petrophysicists and Well-Log Analysts*, SPWLA-1994-A Chen, Z.; Singer, P. M.; Kuang, J.; Vargas, F. M.; Hirasaki, G. J., 2017: Effects of Bitumen Extraction on the 2D NMR Response of Saturated Kerogen Isolates. *Petrophysics*, 58, 470-484.

Chen, Z., Singer, P. M., Wang, X., Vinegar, H. J., Nguyen, S. V., Hirasaki, G. J., 2019: NMR Evaluation of Light-Hydrocarbon Composition, Pore Size, and Tortuosity in Organic-Rich Chalks, *Petrophysics* 60 (06), 771-797

Chen, Z., Singer, P. M., Wang, X., Hirasaki, G. J., Vinegar, H. J., 2019: Evaluation of Light Hydrocarbon Composition, Pore Size, and Tortuosity in Organic-Rich Chalks using NMR Core Analysis and Logging, *Society of Petrophysicists and Well-Log Analysts*, SPWLA-2019-K Chen, Z., Wang, X., Jian, G., Zhang, L., Dong, P., Singer, P. M., & Hirasaki, G. J., 2020: Fast Permeability Estimation of an Unconventional Formation Core by Transient-Pressure History Matching, *Society Petroleum Engineers Journal*

Coates G. R., Miller, M., Gillen, M., Henderson, C., 1991: The MRIL in Conoco 33-1: An Investigation of a New Magnetic Resonance Imaging Log, *Society of Petrophysicists and Well-Log Analysts*, SPWLA-1991-DD Cotts, R. M., Hoch, M. J. R., Sun, T., Markert, J. T.; 1989: Pulsed Field Gradient Stimulated Echo Methods for Improved NMR Diffusion Measurements in Heterogeneous Systems. *J. Magn. Reason.* 83(2), 252-266

Dullien, F. A. L., 1979: *Porous Media Fluid Transport and Pore Structure*. Academic Press Epstein, N., 1989: On Tortuosity and the Tortuosity Factor in Flow and Diffusion Through Porous Media, *Chemical Engineering Science.*, 44, 777-779.

Glover, P. W. J., 2016: Archie's Law—A Reappraisal. *Solid Earth.*, 7, 1157-1169.

Hidajat, I., Mohanty, K. K., Flaum, M., Hirasaki, G. J., 2004, Study of Vuggy Carbonates Using NMR and X-Ray CT Scanning, *SPE Reservoir Evaluation & Engineering*, SPE 88995

Hurlimann, M. D.; Helmer, K. G.; Latour, L. L.; Sotak, C. H., 1994: Restricted Diffusion in Sedimentary Rocks. Determination of Surface-Area-to-Volume Ratio and Surface Relaxivity, Journal of Magnetic Resonance, Series A., 111, 169-178.

Kenyon, W. E., Day, P. I., Straley, C., Willemsen, J. F., 1988: A Three-part Study of NMR Longitudinal Relaxation Properties of Water-saturated Sandstones, *Society Petroleum Engineers*, SPE-15643-PA Latour, L. L.; Mitra, P. P.; Kleinberg, R. L.; Sotak, C. H., 1993: Time-Dependent Diffusion Coefficient of Fluids in Porous Media as a Probe of Surface-to-Volume Ratio. Journal of Magnetic Resonance—Series A., 101, 342-346.

Lee, A. L., Ellington, R. T., 1965, Viscosity of n-Decane in the Liquid Phase, *Journal of Chemical and Engineering Data*, 346-348

Lo, S. W.; Hirasaki, G. J.; House, W. V.; Kobayashi, R., 2002: Mixing Rules and Correlations of NMR Relaxation Time with Viscosity, Diffusivity, and Gas/Oil Ratio of Methane/Hydrocarbon Mixtures. SPE Journal., 7, 24-34.

Minh, C. C., Crary, S., Singer, P. M., Valori, A., Bachman, N., Hursan, G. G., Ma, S., Belowi A., Kraishan G., Kraishan, G. (2015). Determination of Wettability from Magnetic Resonance Relaxation and Diffusion Measurements on Fresh-State Cores. SPWLA 56th Annual Logging Symposium.

Mitchell, J.; Gladden, L. F.; Chandrasekera, T. C.; Fordham, E. J., 2014: Low-Field Permanent Magnets for Industrial Process and Quality Control. Progress in Nuclear Magnetic Resonance Spectroscopy., 76, 1-60.

Mitra, P. P.; Sen, P. N., 1992: Effects of Microgeometry and Surface Relaxation on NMR Pulsed-Field-Gradient Experiments: Simple Pore Geometries. Physical Review B., 45, 143-156.

Monicard, R. P., 1980: *Properties of Reservoir Rocks: Core Analysis*. Springer, Netherlands.

Muller-Huber, E., Schon, J., Borner, F., 2016 A Pore Body-Pore Throat-Based Capillary Approach for NMR Interpretation in Carbonate Rocks using the Coates Equation, *Society of Petrophysicists and Well-Log Analysts*

Rossinni, F. D., Pitzer, K. S., Arnett, R. L., Braun, R. M., Pimente, G. C., 1953 Selected Values of Physical and Thermodynamic Properties of Hydrocarbons and Related Compounds, Tech. Rep. Project 44, American Petroleum Institute, Pittsburgh, PA Sander, R.; Pan, Z.; Connell, L. D., 2017: Laboratory Measurement of Low Permeability Unconventional Gas Reservoir Rocks: A Review of Experimental Methods. Journal of Natural Gas Science and Engineering., 37, 248-279.

Singer, P.; Chen, Z.; Hirasaki, G., 2016: Fluid Typing and Pore Size in Organic Shale Using 2D NMR in Saturated Kerogen Isolates. Petrophysics., 57, 604-619.

Singer, J. M., Johnston, L., Kleinberg, R. L., Flaum, C., 1997, Fast NMR Logging for Bound Fluid and Permeability, *Society of Petrophysicists and Well-Log Analysts*, SPWLA-1997-YY Souza, A., Carneiro, G., Zielinski, L., Polinski, R., Schwartz, L., Hurlimann, M. D., Boyd, A., Rios, E. H., Camilo dos Santos, B. C., Trevizan, W. A., Machado, F. V., Azeredo, R. B. V., 2013: Permeability Prediction Improvement using 2D NMR Diffusion-$T_2$ Maps, *Society of Petrophysicists and Well-Log Analysts*, SPWLA-2013-U Straley, C., Rossini, D., Vinegar, H. J., Tutunjian, P., Morriss, C., 1997: Core Analysis by Low-Field NMR, *Society of Petrophysicists and Well-Log Analysts*, SPWLA-1997-v38n2a3

Swanson, B. F., 1981: A Simple Correlation Between Permeabilities and Mercury Capillary Pressures. Society of Petroleum Engineers. Journal of Petroleum Technology., 33, 2498-2504.

Tanner, J. E., 1970: Use of the Stimulated Echo in NMR Diffusion Studies. The Journal of Chemical Physics., 52, 2523-2526.

Timur, R., 1969: Pulsed Nuclear Magnetic Resonance Studies of Porosity, Movable Fluid, and Permeability of Sandstones, *Society Petroleum Engineers*, SPE-2045-PA Tofts, P. S., Lloyd, D., Clark, C. A., Barker, G. J., Parker, G. J. M., McConville, P., Baldock, C., Pope, J. M., 2000 Test Liquids for Quantitative MRI Measurements of Self-Diffusion Coefficient In Vivo, Magn. Reson. Med. 43, 368-374

Venkataramanan, L.; Song, Y. Q.; Hürlimann, M. D., 2002: Solving Fredholm integrals of the first kind with tensor product structure in 2 and 2.5 dimensions. *IEEE Transactions on Signal Processing.*, 50, 1017-1026.

Vinegar, E. G.; Rosenberg, Y. O.; Reznick, I.; Gordin, Y.; Singer, Philip M. S.; Wang, X.; Chen, Z.; Nguyen, S. V.; Li, W.; Bradley, T.; Hirasaki, G. J.; Lake, L. W.; Feinstein, S.; Hatzor, Y. H.; Vinegar, H. J., 2020. What Happens to the Petrophysical Properties of a Dual-Porosity Organic-Rich Chalk During Early-Stage Organic Maturation? Society of Petrophysicists and Well-Log Analysts.

Wang, X., Singer, P. M., Chen, Z., Hirasaki, G. J., Vinegar, H. J., 2020: A New Method of Estimating Tortuosity and Pore Size in Unconventional Formations using NMR Restricted Diffusion Measurements, *Society of Petrophysicists and Well-Log Analysts*

Webber, J. B. W., 2010 Studies of Nano-Structured Liquids in Confined Geometries and at Surfaces, *Progress in Nuclear Magnetic Resonance Spectroscopy* 56 78-93

Wyllie, M. R. J.; Rose, W. D., 1950: Some Theoretical Considerations Related To The Quantitative Evaluation Of The Physical Characteristics Of Reservoir Rock From Electrical Log Data, *Journal of Petroleum Technology.*, 2, 105-118

Yang, K.; Li, M.; Ling, N. N. A.; May, E. F.; Connolly, P. R. J.; Esteban, L.; Clennell, M. B.; Mahmoud, M.; El-Husseiny, A.; Adebayo, A. R.; Elsayed, M. M.; Johns, M. L., 2019: Quantitative Tortuosity Measurements of Carbonate Rocks Using Pulsed Field Gradient NMR, *Transport in Porous Media*, 130, 847-865.

Zecca, M.; Vogt, S. J.; Connolly, P. R. J.; May, E. F.; Johns, M. L., 2018: NMR Measurements of Tortuosity in Partially Saturated Porous Media. *Transport in Porous Media*, 125, 271-288.

Zielinski, L.; Ramamoorthy, R.; Minh, C. C.; Al Daghar, K. A.; Sayed, R. H.; Abdelaal, A. F., 2010: Restricted Diffusion Effects in Saturation Estimates From 2D Diffusion-Relaxation NMR Maps. *Society of Petroleum Engineers*.

ABBREVIATIONS

ASREC: as-received core
C10: decane-saturated core
C4: butane-saturated core
C1(D2O): methane-saturated core with D2O
D2O: deuterated core
NMR: Nuclear Magnetic Resonance
PFG: pulse-field gradient
RF: radio frequency
CPMG: Carr-Purcell-Meiboom-Gill sequence
PTFE: polytetrafluoroethylene
PEEK: polyether ether ketone
HI: hydrogen index
pu1: porosity unit from 1D $T_2$ assuming HI=1
$pu1_D$: porosity unit from $D-T_2$ assuming HI=1
SW1: 100% brine saturated

SYMBOLS $\tau_e$: electrical tortuosity
$F_R$: resistivity formation factor
$\phi$: porosity
m: Archie cementation exponent
$L_e$: true travel length for molecule
L: direct geometry
$\tau$: diffusive tortuosity
$D_0$: free self-diffusion of bulk fluid
$D_\infty$: restricted self-diffusion in the tortuosity limit
D: restricted diffusivity
$D_{slope}$: diffusion coefficient from initial slope of diffusion decay
$D_{1Dpeak}$: diffusion coefficient from peak of D distribution
$D_{2Dpeak}$: diffusion coefficient from peak of $D-T_2$ map
$D_{LM}$: diffusion coefficient from log-mean of D distribution
$\tau_A$: diffusion time
S/V: surface-to-volume ratio
$L_D$: diffusion length
$L_M$: heterogeneity length-scale
d: cylindrical pore-body diameter
$d_{MICP}$: cylindrical pore-body diameter
$T_1$: longitudinal relaxation time
$T_{1LM}$: log mean longitudinal relaxation time
$T_2$: transverse relaxation time
$T_{2B}$: transverse relaxation time of bulk fluid
$T_{2s}$: surface transverse relaxation time
$t_\delta$: duration of the gradient encoding pulses
G: gradient in trapezoidal gradient encoding pulses
∈: ramp-time
$t_D$: dead time
$\phi_{1,2,3,a}$: RF phases
q: wavevector for diffusion encoding
$\gamma/2\pi$: gyro-magnetic ratio
P: probability density function
$\phi_{DT_2}$: total porosity from $D-T_2$ map
$\Delta$: logarithmic bin spacings of the 2D map
B: boosting factor
$t_E$: echo space
$\rho$: surface relaxivity

The invention claimed is:
1. A method of mapping, in at least a vertical direction, subsurface permeability as a function of downhole-location, the method comprising:
   a. acquiring a set CORE_SET of N core samples {$CS_1$, $CS_2$ ... $CS_N$} where $CS_i$ is the $i^{th}$ core sample, and N is a positive integer, and $1 \le i \le N$, wherein each core-sample $CS_i$ is extracted from a respective downhole extraction-location EXTRACTION-LOC($CS_i$) within the subsurface;
   b. for each core sample $CS_i$ of CORE_SET, respectively performing the following set of measurements:
      (i) a respective lab-NMR measurement of a respective porosity $\phi_M(CS_i)$ describing the porosity of movable hydrocarbons;

(ii) a respective lab-NMR measurement of one or more pore-dimension properties; and (iii) a respective lab measurement of the permeability $k(CS_i)$ of the core sample $CS_i$;

c. for each core sample $CS_i$ of CORE_SET, estimating a respective downhole hydraulic tortuosity $\tau_{hy}$(EXTRACTION-LOC($CS_i$)) representing the downhole tortuosity at the extraction-location from which core sample $CS_i$ was extracted;

d. computing, from the results of steps (b) and (c), an at least 1-D BTR-map of subsurface BTR (body throat ratio) as a function of subsurface location;

e. for a plurality of downhole locations, downhole-NMR-logging the following parameters: (i) subsurface porosity; and (ii) a subsurface pore-size parameter;

f. computing an at least 1-D map of subsurface permeability as a function of downhole-location from all of the following: (i) the at least 1-D BTR-map; (ii) the results of the downhole-NMR-logging; and (iii) the results of step (c).

2. The method of claim 1 wherein the lab-NMR-measured pore-dimension property of step b(ii) is a surface-to-volume ratio.

3. The method of claim 1 wherein the lab-NMR-measured pore-dimension property of step b(ii) is a pore diameter.

4. The method of claim 1 wherein step (d) comprises computing, from the results of steps (b) and (c), a respective laboratory BTR($CS_i$) value for each core sample $CS_i$.

5. The method of claim 4 wherein the respective laboratory BTR($CS_i$) value is computed using a modified Carman-Kozeny relationship.

6. The method of claim 1, further comprising drilling one or more horizontal or vertical wells in location(s) determined by the content of the at least 1-D map of subsurface permeability.

7. The method of claim 1 further performing at least one of the following in location(s) determined by the content of the at least 1-D map of subsurface permeability: (i) casing and perforating; and (ii) deploying a pump in the well.

8. The method of claim 1 wherein the core samples of CORE_SET are obtained from a selection of depths covering different lithologies (i.e. rock types).

9. The method of claim 1 wherein step (b)(i) comprises saturating, in the laboratory, each core sample with decane and step b(ii) comprises saturating, in the laboratory, each core sample with methane.

10. The method of claim 1 wherein step (b)(i) comprises measuring, in the laboratory, D-$T_2$, on core samples of CORE_SET to determine a respective movable hydrocarbon fluid porosity $\phi_M(CS_i)$ i.e. porosity above $T_2 > T_{2cutoff}$.

11. The method of claim 1 wherein step (b)(ii) comprises measuring, in the laboratory, restricted diffusion (D/$D_0$), where $D_0$ is bulk diffusion versus diffusion length $$\left(L_D = \sqrt{D_0 t_\Delta}\right),$$

where $t_\Delta$ is the diffusion encoding time.

12. The method of claim 11 wherein step b(ii) comprises fitting D/$D_0$ versus $L_D$ using Padé fit to determine pore body size (d), heterogeneity length scale ($L_M$), and tortuosity ($\tau$) for each core.

13. The method of claim 1 wherein step b(iii) is performed by setting each core sample $CS_i$ in a Hassler sleeve and applying confining stress on the sample $CS_i$ and then flowing fluid (either gas or liquid) through each sample $CS_i$ to produce a pressure drop across the sample $CS_i$ and measuring the fluid flow rate.

14. The method of claim 1 wherein step (c) comprises subjecting each core sample $CS_i$ to laboratory NMR.

15. The method of claim 1 wherein step (c) is performed by at least one of (i) downhole NMR and (iii) downhole electrical resistivity measurements, for example, at EXTRACTION-LOC($CS_i$).

16. The method of claim 1 wherein step (f) comprises employing at least one of the modified Carman-Kozeny equations.

17. A method comprising performing NMR restricted diffusion measurements on a core with connate water present by:

a) pressure-saturating the core with two hydrocarbons (sequentially high-pressure methane and decane, or high-pressure methane and high-pressure butane), b) measuring NMR restricted diffusion of the two hydrocarbons under pressure in the core to obtain their restricted diffusivity in the hydrocarbon-bearing porosity of the core, c) estimating the tortuosity and surface-to-volume ratio of the hydrocarbon-filled pore space of the core, and d) using the tortuosity, surface-to-volume ratio, and porosity occupied by the hydrocarbon fluids, and estimating the pore body-to-pore-throat ratio for the lithology, determining the permeability of the mobile hydrocarbons in the core.

18. The method of claim 17 wherein the tortuosity and pore size are determined by applying a Padé fit to restricted diffusivity NMR measurements of the two hydrocarbons.

19. The method of claim 17 wherein the two hydrocarbons comprise methane and at least one other hydrocarbon such as decane or butane.

20. The method of claim 17 wherein the equation for the permeability of the mobile hydrocarbons in the core is given by the equation $$k = \frac{\phi d^2}{32 \tau BTR^2}.$$

21. A method comprising obtaining a downhole wireline permeability log by measuring NMR diffusion-$T_2$ (D-$T_2$), and permeability on a selection of cores of different lithologies (i.e. rock types), then using the core-calibrated parameters with D-$T_2$ well logs to obtain a permeability well log, the method comprising the following steps:

a. obtaining cores from a selection of depths covering different lithologies, b. measuring D-$T_2$ on cores to determine movable fluid porosity ($\phi_M$), i.e. porosity above $T_2 > T_{2cutoff}$ and restricted diffusion (D/$D_0$), where $D_0$ is bulk diffusion versus diffusion length $$\left(L_D = \sqrt{D_0 t_\Delta}\right),$$

where $t_\Delta$ is the diffusion encoding time) using a light hydrocarbon and a heavier hydrocarbon to cover a range of $L_D$, c. fitting D/$D_0$ versus $L_D$ using Padé fit to determine pore body size (d), heterogeneity length scale ($L_M$), and tortuosity ($\tau$) for each core, d. determining the cementation exponent (m) for each lithology using $$\tau = \phi_M^{1-m},$$

e. determining the heterogeneity length-scale ($L_M$) for each lithology,
f. measuring core permeability (k) and determining the body-throat ratio BTR for each lithology from the Carman-Kozeny equation $$k = \frac{\phi_M d^2}{32\tau BTR^2},$$

g. measuring D-$T_2$ log to determine movable fluid porosity ($\phi_{M,log}$), i.e. porosity above $T_2 > T_{2cutoff}$, and $D_{log}/D_0$ versus $T_2$, h. determining tortuosity log ($\tau_{log}$) using $$\tau_{log} = \phi_{M,log}^{1-m},$$

where m is known for each lithology from step (d),
i. fitting $D_{log}/D_0$ versus $T_2$ using Padé fit to determine pore-body size ($d_{log}$), with $\tau_{log}$ known from step (h), and $L_M$ fixed for each lithology from step (e), and
j. determining downhole permeability ($k_{log}$) from $$k_{log} = \frac{\phi_{M,log} d_{log}^2}{32\tau_{log} BTR^2},$$

with BTR known for each lithology from step (f).

* * * * *